United States Patent
Stipe

(10) Patent No.: US 7,291,878 B2
(45) Date of Patent: Nov. 6, 2007

(54) ULTRA LOW-COST SOLID-STATE MEMORY

(75) Inventor: Barry Cushing Stipe, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 190 days.

(21) Appl. No.: 10/751,740

(22) Filed: Jan. 5, 2004

(65) Prior Publication Data

US 2004/0245547 A1    Dec. 9, 2004

Related U.S. Application Data

(63) Continuation-in-part of application No. 10/453,137, filed on Jun. 3, 2003, now abandoned.

(51) Int. Cl.
*H01L 27/108* (2006.01)
(52) U.S. Cl. .................................. 257/296
(58) Field of Classification Search ............ 257/296, 257/300, 307
See application file for complete search history.

(56) References Cited

U.S. PATENT DOCUMENTS

| | | | |
|---|---|---|---|
| 5,598,366 A * | 1/1997 | Kraus et al. ............... 365/145 |
| 5,815,310 A | 9/1998 | Williamson |
| 6,301,145 B1 | 10/2001 | Nishihara |
| 6,429,449 B1 | 8/2002 | Gonzalez et al. |
| 2004/0047219 A1 * | 3/2004 | Ito ............................ 365/222 |
| 2005/0064731 A1 * | 3/2005 | Park et al. ................. 438/800 |

OTHER PUBLICATIONS

D. Takashima, "Overview and Trend of Chain FeRAM Architecture," IEICE. Trans. Electron., vol. E84-C, No. 6, pp. 747 756, Jun. 2001.
A.F. Tasch et al., "Memory Cell and Technology Issues for 64 and 256-Mbit One-Transistor Cell MOS DRAMs," Proceedings of the IEEE, vol. 77, No. 3, pp. 374 388, Mar. 1989.
T. Tybell et al., "Ferroelectricity in Thin Perovskite Films," Applied Physics Letters, vol. 75, No. 6, pp. 856 858, Aug. 9, 1999.
P. Vettiger et al., "The Millipede—Nanotechnology Entering Data Storage," IEEE Transactions of Nanotechnology, vol. 1, No. 1, pp. 39 55, Mar. 2002.

(Continued)

*Primary Examiner*—Bradley K. Smith
(74) *Attorney, Agent, or Firm*—Joseph P. Curtin; Darren Gold

(57) ABSTRACT

A three-dimensional solid-state memory is formed from a plurality of bit lines, a plurality of layers, a plurality of tree structures and a plurality of plate lines. Bit lines extend in a first direction in a first plane. Each layer includes an array of memory cells, such as ferroelectric or hysteretic-resistor memory cells. Each tree structure corresponds to a bit line, has a trunk portion and at least one branch portion. The trunk portion of each tree structure extends from a corresponding bit line, and each tree structure corresponds to a plurality of layers. Each branch portion corresponds to at least one layer and extends from the trunk portion of a tree structure. Plate lines correspond to at least one layer and overlap the branch portion of each tree structure in at least one row of tree structures at a plurality of intersection regions.

29 Claims, 19 Drawing Sheets

OTHER PUBLICATIONS

J. Wang et al., "Does Source-to-Drain Tunneling Limit the Ultimate Scaling of MOSFETs?" IEDM Tech. Digest (IEEE), pp. 707 710 (2002).

R. Wood, "Recording Technologies for Terabit per Square Inch Systems," IEEE Transactions on Magnetics, vol. 38, No. 4, pp. 1711 1718, Jul. 2002.

S. Yasin et al., "Comparison of MIBK/IPA and Water/IPA as PMMA Developers for Electron Beam Nanolithography," Microelectronic Engineering, vol. 61-62, pp. 745 753 (2002).

E. Yenilmez et al., "Wafer Scale Production of Carbon Nanotube Scanning Probe Tips for Atomic Force Microscopy," Applied Physics Letters, vol. 80, No. 12, pp. 2225 2227, Mar. 25, 2002.

W.W. Zhuang et al., "Novell Colossal Magnetoresistive Thin Film Novolatile Resistance Random Access Memory (RPAM)," IEDM Tech. Digest (IEEE). p. 193 (2002).

O. Auciello et al., "The Physics of Ferroelectric Memories," Physics Today, vol. 51, pp. 22 27 (1998).

Y. Cho et al., "Tbit/inch2 Ferroelectric Data Storage Based on Scanning Nonlinear Dielectric Microscopy," Applied Physics Letters, vol. 81, No. 23, pp. 4401 4403, Dec. 2, 2002.

E.B. Cooper et al., "Terabit-Per-Square-Inch Data Storage with the Atomic Force Microscope," Applied Physics Letters, vol. 75, No. 22 p. 9, 3566 3568. Nov. 29, 1999.

Executive Summary, International Technology Roadmap For Semiconductors, 2001 Edition, http://public.itrs.net.

A. Fazio et al., "ETOX Flash Memory Technology: Scaling and Integration Challenges," Intel Technology Journal, vol. 6, Issue 02, pp. 23 30, May 16, 2002.

P.P. Freitas et al., "Spin Dependent Tunnel Junctions for Memory and Read-Head Applications," IEEE Transactions on Magnetics, vol. 36, No. 5, pp. 2796 2801, Sep. 2000.

M. Gill et al., "Ovonic Unified Memory—a High-Performance Nonvolatile Memory Technology for Stand-Alone Memory and Embedded Applications," ISSCC Tech. Digest (IEEE), p. 202 (2002).

K.W. Guarini et al., "Electrical Integrity of State-of-the-Art 0.13 µm SOI CMOS Devices and Circuits Transferred for Three-Dimensional (3D) Integrated Circuit (IC) Fabrication," IEDM Tech. Digest (IEEE), pp. 943 945 (2002).

K. Inomata, "Present and Future of Magnetic RAM Technology," IEICE. Trans. Electron., vol. E84-C, No. 6, pp. 740 746, Jun. 2001.

T. Kijima et al., "Si-Substituted Ultrathin Ferroelectric Films," Jpn. J. Appl. Phys., vol. 41 (2002), pp. L716 L719, Part 2, No. 6B, Jun. 15, 2002.

O.-H. Kim et al., "Effects of High-Current Pulses on Polycrystalline Silicon Diode with N-Type Region Heavily Doped with both Boron and Phosphorus," Journal of Applied Physics, vol. 53, No. 7, pp. 5359-5360, Jul. 1982.

J.-D. Lee et al., "Effects of Floating-Gate Interference on NAND Flash Memory Cell Operation," IEEE Electron Device Letters, vol. 23, No. 5, pp. 264 266, May 2002.

T.H. Lee, "A Vertical Leap for Microchips," Scientific American, vol. 286, p. 52 (2002).

M. Mallary et al., "One Terabit per Square Inch Perpendicular Recording Conceptual Designs," IEEE Transactions on Magnetics, vol. 38, No. 4, pp. 1719 1724, Jul. 2002.

J.A. Mandelman et al., "Challenges and Future Directions for the Scaling of Dynamic Random-Access Memory (DRAM)," IBM Journal of Research and Development, vol. 46, No. 2, pp. 187 212, Mar./May 2002.

E. Muzio et al., "Lithography CoO. Lithography Cost of Ownership Analysis," Revision No. 4.0, Revision Date: Dec. 1999, International SEMATECH Lithography Division, http://www.sematech.org/public/resources/litho/coo/index.htm.

T. Nishihara et al., "A Quasi-Matrix Ferroelectric Memory for Future Silicon Storage," IEEE Journal of Solid-State Circuits, vol. 37, No. 11, pp. 1479 1484, Nov. 2002.

K. Sakaguchi et al., "Current Progress in Epitaxial Layer Transfer (ELTRAN)," IEICE. Trans. Electron., vol. E80 C, No. 3, pp. 378 387, Mar. 1997.

A. Sheikholeslami et al., "A Survey of Circuit Innovations in Ferroelectric Random-Access Memories," Proceedings of the IEEE, vol. 88, pp. 667-689 (2000).

G. Steinlesberger et al., "Copper Damascene Interconnects for the 65 nm Technology Node: A First Look at the Reliability Properties," IEEE Interconnect Technology Conference Proceedings, pp. 265 267 (2002).

* cited by examiner

| | SRAM | DRAM | HDD | FLASH | PROBE | OUM | MTJ-MRAM | 3D-MRAM | MATRIX | 1T FeRAM | OT FeRAM |
|---|---|---|---|---|---|---|---|---|---|---|---|
| Cell size | $50F^2$ | $8F^2$ | $5F^2$ | $5F^2$ | $5F^2$ | $5F^2$ | $8F^2$ | $5F^2$ | $5F^2$ | $8F^2$ | $5F^2$ |
| Minimum "F" | 10 nm | 30 nm | 10 nm | 30 nm | 3 nm | 10 nm | 40 nm | 40 nm | 10 nm | 10 nm | 10 nm |
| Max. bits/cell | 1 | 1 | 1 | 4 | 1 | 2 | 1 | 1 | 1 | 1 | 1 |
| Max. layers | 1 | 1 | 1 | 1 | 1 | 4 | 1 | 12 | 12 | 1 | 16 |
| Maximum density | $0.1\ Tb/in^2$ | $0.07\ Tb/in^2$ | $1\ Tb/in^2$ | $0.4\ Tb/in^2$ | $10\ Tb/in^2$ | $8\ Tb/in^2$ | $0.04\ Tb/in^2$ | $0.75\ Tb/in^2$ | $12\ Tb/in^2$ | $0.6\ Tb/in^2$ | $16\ Tb/in^2$ |
| Cost/area (AU) | 10 | 10 | 1 | 10 | 10 | 16 | 10 | 16 | 16 | 10 | 16 |
| Min. cost/bit (AU) | 100 | 140 | 1 | 22 | 1 | 2 | 250 | 20 | 1.3 | 15 | 1 |
| Retention | with power | 0.1 sec | > 10 yrs | > 10 yrs | > 10 yrs | > 10 yrs | > 10 yrs | > 10 yrs | > 10 yrs | > 10 yrs | > 10 yrs |
| Endurance | $>10^{15}$ | $>10^{15}$ | $>10^{12}$ | $>10^{6}$ | $>10^{5}$ | $>10^{13}$ | $>10^{15}$ | $>10^{15}$ | 1 | $>10^{14}$ | $>10^{14}$ |
| Byte access | Yes | Yes | No | No | No | Yes | Yes | Yes | Yes | Yes | No |
| Min. read time | 0.2 ns | 1 ns | $10^6$ ns | 5 ns | $10^6$ ns | 5 ns | 1 ns | $10^4$ ns | $10^4$ ns | 1 ns | 5 ns |
| Min. write time | 0.2 ns | 1 ns | $10^6$ ns | $10^6$ ns | $10^6$ ns | 50 ns | 1 ns | $10^4$ ns | $10^4$ ns | 1 ns | 10 ns |
| Write energy/bit | LOW-HIGH | HIGH | VERY HIGH | VERY HIGH | VERY HIGH | HIGH | MED.-HIGH | MED.-HIGH | HIGH | LOW | LOW |
| Revenue (2002) | $4 Billion | $17 Billion | $20 Billion | $8 Billion | DEV. | DEV. | DEV. | RES. | DEV. | $0.1 Billion | RES. |

*FIG. 1*

ULTRA LOW-COST SOLID-STATE MEMORY

CROSS-REFERENCE TO RELATED APPLICATION

The present application is a continuation-in-part application of commonly assigned U.S. patent application Ser. No. 10/453,137 by Barry Stipe, filed Jun. 3, 2003 now abandoned, entitled "Ultra Low-Cost Solid-State Memory," and incorporated by reference herein.

BACKGROUND OF THE INVENTION

1. Field of the Invention

The present invention relates to solid-state memories. In particular, the present invention relates to a three-dimensional (3-D) arrangement of memory cells forming an ultra-low-cost solid-state memory.

2. Description of the Related Art

FIG. 1 shows a table setting forth estimated scaling limits, estimated performance characteristics and estimated costs for current and potential solid-state memory technologies, as projected for the year 2020. Revenue estimates for 2002 are given or are indicated as DEV for technologies that are still under development and RES for technologies in the research stage. Important factors influencing the cost per bit for the solid-state memories shown in FIG. 1 include the scalability to the smallest dimensions, the number of bits per cell, and the cost of three-dimensional (3-D) integration.

The scaling limits indicated for each solid-state technology are speculative and are based primarily on physical limits rather than current technical challenges. The cost of processing a unit area of silicon has remained fairly constant over the years, and has historically been about ten times higher than the cost per unit area for low-cost 3.5" Hard Disk Drives (HDDs). It has been estimated that use of 300 mm wafers will lower the cost per unit area by about 30%. Nevertheless, current desk-top HDDs are about 100 times cheaper per bit than DRAM and FLASH memories because HDDs have an areal density that is about ten times greater than DRAM or FLASH memories. For the memory technologies identified in FIG. 1 that are capable of low-cost 3-D integration, it is assumed that layers are added until the cost per unit area increases by 60%, thereby providing a good trade-off between lower cost and manufacturability.

Four technologies may eventually reach a cost that is comparable to that of HDDs through either multi-bit storage or 3-D integration, which are two characteristics that HDDs cannot practically possess. Two of the four technologies, PROBE memories and MATRIX memories, are likely to have performance characteristics that are inferior to HDDs. The other two technologies, Ovonic Universal Memory (OUM) and zero-transistor ferroelectric memory (0T-Fe-RAM), are likely to have superior performance to HDDs and are potential replacement technologies for HDDs. Even if a high-performance memory is twice as expensive as HDDs, it may still be widely preferable because large amounts of DRAM (or other memory) would not be required for buffering the processor.

The scaling limits and associated cost estimates for the various memory technologies shown in FIG. 1 are described below:

SRAM

Static Random Access Memory (SRAM) cell is formed by six MOSFETs, so scaling challenges are the same as for transistors and wires. The most scalable MOSFET design is generally believed to be the double-gate transistor. See, for example, J. Wang et al., "Does Source-to-Drain Tunneling Limit the Ultimate Scaling of MOSFETs?" IEDM Tech. Digest (IEEE), p. 707 (2002). Because the gates must be insulated from the channel and the insulation must be thicker than about 2 nm to prevent excessive gate tunneling current, the gates must be separated by at least 4 nm plus the thickness of the channel. Roughly speaking, the channel length must be at least as long as the gate-to-gate distance for the transistor to properly turn off, even when a high-k dielectric insulation is used. Consequently, the smallest workable transistor is on the order of 5 to 6 nm in length.

Today, gate lengths are about 65 nm using lithography that is capable of 130 nm half-pitch between wires so the smallest transistors would be appropriate for the 11 nm node in about 2020. See, for example, http://public.itrs.net. Extremely advanced lithography will be required for 11 nm half-pitch node. The minimum half-pitch for Extreme-UV (EUV) lithography at a wavelength of 11 or 13 nm is given by $F=k_1\lambda/NA$, in which $k_1$ is a constant having a minimum value of about 0.25 using phase shift masks, $\lambda$ is the wavelength and NA is the numerical aperture having a maximum value of about 0.55 for the reflective optics that are used for EUV lithography. See, for example, U.S. Pat. No. 5,815,310 to D. M. Williamson entitled "High Numerical Aperture Ring Field Optical Reduction System." Although these particular parameters indicate that the lithography limit is about 5 nm half-pitch, it is unlikely this limit will be reached.

If the more conservative parameter values are considered, i.e., $k_1=NA=0.4$, then the limit is at the 11 nm node. If transistor gate lengths must be somewhat longer than 6 nm, memory density will not be very adversely affected because the cell size is determined more by the wire pitch than by gate length.

The minimum cell size for SRAM is large at about $50\ F^2$, consequently, the maximum density for F=11 nm is about $0.1\ Tb/in^2$. It is expected that SRAM will continue to be used in the future for applications in which speed is most important because SRAM is the fastest performing memory type for both reading and writing.

DRAM

A Dynamic Random Access Memory (DRAM) cell is formed by a MOSFET and a capacitor. The voltage stored on the capacitor must be refreshed about every 0.1 s due to leakage. DRAM memory has very serious scaling challenges. See, for example, J. A. Mandelman et al., "Challenges and Future Directions for the Scaling of Dynamic Random-Access Memory (DRAM)," IBM Journal of Research and Development, vol. 46, p. 187 (2002). For example, one of the most serious scaling obstacles for DRAM memory results from the adverse effects of radiation in which a single alpha particle can create about 1 million minority carriers that sometimes end up on the capacitor. For immunity from the effects of radiation, the capacitor must hold more than 1 million electrons, corresponding to a capacitance of about 30 fF. See, for example, A. F. Tasch et al., "Memory Cell and Technology Issues for 64 and 256-Mbit One-Transistor Cell MOS DRAMs," Proceedings of the IEEE, vol. 77, p. 374 (1989).

In DRAM, reading the state of the capacitor is destructive, so the data must be rewritten afterward. With conventional architecture, the state of the capacitor is sensed by discharging the capacitor to a bit line having a capacitance that is much greater than 30 fF. Further reductions in storage capacitance would lower the sense voltage to levels that are not easily detectable. Because the capacitance cannot be readily scaled, the capacitor has presently taken the form of a cylinder extending deep into the silicon wafer and having an aspect ratio of about 50 to 1. An aspect ratio of this magnitude does not appear to be capable of being increased much further and soon capacitors will need to flare out under the silicon surface taking the shape of, for example, a bottle. Also, high-k dielectrics, such as barium strontium titanate (BST), will be needed for improving performance of the capacitor. Unfortunately, high-k dielectrics have a high leakage and, therefore, need a thickness that is thicker than that of the dielectric materials that are used today. Accordingly, the thickness of high-k dielectrics can add considerably to the diameter of nanometer-scale capacitors. With such scaling obstacles, it seems unlikely that DRAM will scale to be smaller than about 30 nm.

HDDs

Historically, Hard Disk Drives (HDDs) have about ten times greater data density than DRAM or FLASH memories because there is little or no space between bits and data tracks. Additionally, bit density along the track is determined primarily by field gradient and head fly-height rather than by a minimum lithographic dimension. Only track density is determined by lithography. The areal density advantage of HDDs, however, is likely to decrease due to the superparamagnetic limit in which scaling of magnetic grain size in the disk is no longer possible because thermal energy kBT begins to compete with the magnetic anisotropy energy $K_u V$. For written data to be thermally stable for a period of several years (at about 330 K), the minimum size of a magnetic grain is limited to approximately 8 nm.

Although materials exist having a minimum stable size of approximately 3 nm, the coercivity of these materials is higher than the maximum attainable field that can be produced by a write head. About 10-20 grains will be needed per bit to prevent excessive error correction from reducing the data density because the grains are randomly oriented. See, for example, R. Wood, "Recording Technologies for Terabit per Square Inch Systems," IEEE Transactions of Magnetics, vol. 38, p. 1711, 2002, and M. Mallary et al., "One Terabit per Square Inch Perpendicular Recording Conceptual Design," IEEE Transactions of Magnetics, vol. 38, p. 1719, 2002.

Although it is generally accepted that the areal density limit for conventional recording is about 1 Tb/in$^2$, it may be possible to use a revolutionary technology, such as thermally-assisted recording in which the disk is heated to lower the coercivity of the media for writing. Nevertheless, there is a limit when thermal energy $k_B T$ begins to compete with the Zeeman energy $2H_A M_s V$, in which $H_A$ is the applied field, so that the grains are not properly oriented during writing. This effect limits the grain size to about 4 nm, which is a factor of two smaller than the grain size used for conventional recording. Unfortunately, there is no known practical way to make a nanometer-scale heat spot on the disk.

Patterned media has also been proposed as a way to surpass 1 Tb/in$^2$. An e-beam master is used to stamp a pattern into the disk to form magnetic islands so that there can be only 1 grain per bit. Unfortunately, e-beam lithography resolution is limited by secondary electrons exposing the resist, thereby making it currently impossible to surpass 1 Tb/in$^2$. See, for example, S. Yasin et al., "Comparison of MIBK/IPA and Water/IPA as PMMA Developers for Electron Beam Nanolithography," Microelectronic Engineering, vol. 61-62, p. 745, 2002. FIG. 1 indicates the density limit for HDDs to be 1 Tb/in$^2$, which may be reached as early as the year 2010.

FLASH

FLASH memory technology uses a single floating-gate transistor per cell. Typically, FLASH memory is used when an HDD is too bulky. FLASH memory has a fast read time, a relatively slow write time, a low data rate and low endurance. The cost of FLASH memories, however, is rapidly dropping and is expected to be the fastest growing memory type over the next few years, especially for NAND and AND-type FLASH memory architectures. For small capacities, the cost of FLASH memory is currently cheaper than HDDs because HDDs cannot cost much less than $50 based on fixed costs. Today, FLASH memory prices are cut in half every year due to aggressive scaling and the recent introduction of two-bits-per-cell technology. Four-bits-per-cell technology is expected to be available within a few years.

Although multi-bit storage techniques reduce estimated cost dramatically, multi-bit storage typically leads to lower performance because the read/write process is more complicated. The capability of FLASH memory to store multiple-bits per cell is based on the ability of the floating gate to store a very large number of electrons, thereby varying transistor conductance over many orders of magnitude. Therefore, FLASH memory has very fine granularity and low noise with today's technology.

FLASH memory, however, has very serious scaling challenges because the dielectric around the floating gate must be at least 8 nm thick to retain charge for ten years. See, for example, A. Fazio et al., "ETOX Flash Memory Technology: Scaling and Integration Challenges," Intel Technology Journal, vol. 6, p. 23, 2002. This thickness is four times thicker than the thickness of the gate dielectric used in SRAM. Also, the voltage used for programming FLASH memories must be greater than about 8 volts, making it difficult to scale the peripheral transistors that are used to supply the programming voltage.

NOR FLASH memory is not believed to be scalable past the 65 nm node due to problems with drain-induced barrier lowering during programming at this length scale. See, A. Fazio et al., supra. Similarly, NAND FLASH memory is projected to have very serious scaling challenges below 40 nm due to interference between adjacent gates, particularly for multi-bit storage. See, for example, J.-D. Lee et al., "Effects of Floating-Gate Interference on NAND Flash Memory Cell Operation," IEEE Electron Device Letters, vol. 23, p. 264, 2002.

Scaling projections for NAND FLASH memory, which are shown in FIG. 1, are based on the assumption that further improvements will scale NAND or NROM FLASH memory to about 30 nm half-pitch using four-bits-per-cell technology. Below this size, the small number of electrons per bit, the size of the high voltage circuits, and interference between charge storage regions will likely cause obstacles too significant for further scaling.

PROBE

Probe memory technology primarily refers to the "Millipede" concept for data storage being pursued by IBM in which a 2-D array of silicon cantilevers having very sharp silicon tips are scanned over a thin polymer film on a silicon substrate and heated for poking holes in the polymer. See, for example, P. Vettiger et al., "The Millipede—Nanotechnology Entering Data Storage," IEEE Transactions of Nanotechnology, vol. 1, p. 39, 2002. Bits are detected by sensing the cooling of the cantilever when the tips dip down into the holes. Access times are about as long as for an HDD because the entire chip must be moved relative to the tip array to reach the desired memory address. Data rates are quite low compared to HDDs. That is, it will take a row of 400 cantilevers in a 160,000 cantilever array operating at about 100 KHz each to achieve a data rate of 4 MB/s. If this data rate can be achieved, PROBE memory would be competitive with FLASH and the 1" Microdrive.

Power dissipation, however, is very high for both reading and writing because micron-scale heaters are used at temperatures of up to 400 C dissipating about 5 mW each. Consequently, a 4 MB/s data rate would require 2 W of dissipation, thereby making PROBE storage two times less energy efficient per bit than the Microdrive and at least 20 times less efficient than FLASH memory. PROBE storage is inherently 2-D in nature and is not likely to be capable of multi-bit storage due to noise and other issues, although in theory there could be three layers of polymer with different glass transition temperatures to vary the depth with applied temperature and store 2 bits per indent.

So far, the estimated cost per unit area is uncertain, but is likely to be at least as expensive as other solid-state memories because two silicon wafers are used in a precise sandwich arrangement and a substantial amount of peripheral control circuitry is needed. Alignment and thermal drift are a major problem and it is likely that a number of thermal sensors and compensation heaters will be needed to keep top and bottom wafers isothermal and to within one degree of each other. Tip wear and polymer durability are other major issues.

PROBE storage, however, has a major advantage in that bit size is determined by tip sharpness rather than by lithography. Also, because the polymer is amorphous, grain size limitations do not occur. In that regard, IBM has demonstrated an areal density of 1 Tb/in$^2$ using silicon tips. Improvements in tip technology might make it possible to improve the density significantly. Local oxidation storage at >1 Tb/in$^2$ has been demonstrated with a nanotube tip. See, for example, E. B. Cooper et al., "Terabit-Per-Square-Inch Data Storage with the Atomic Force Microscope," Applied Physics Letters, vol. 75, p. 3566, 1999. If a manufacturable method of forming ultra-sharp, durable tips can be developed, perhaps 10 Tb/in$^2$ is possible. See for example, E. Yenilmez et al., "Wafer Scale Production of Carbon Nanotube Scanning Probe Tips for Atomic Force Microscopy," Applied Physics Letters, vol. 80, p. 2225, 2002.

OUM

Another emerging memory technology is known as Ovonic Universal Memory (OUM). See, for example, M. Gill et al., "Ovonic Unified Memory—a High-Performance Nonvolatile Memory Technology for Stand-Alone Memory and Embedded Applications," ISSCC Tech. Digest (IEEE), p. 202, 2002. OUM uses one programmable resistor and one diode (or transistor) per cell. The high and low resistance states of a phase-change resistor (amorphous versus crystalline) is used for storing bits. OUM writing is accomplished by passing high current through the resistor to bring the material to the crystallization temperature or melting temperature (about 400 to 600 C). Rapid cooling of the melted material results in the amorphous (high resistance) phase. Writing the crystalline phase requires a longer time for nucleation and growth to occur (about 50 ns) and results in about 100 times lower resistance than in the amorphous phase.

Intermediate values of resistance can be set by controlling the current (and, therefore, temperature) during the programming pulse, thereby making multi-bit storage possible with OUM, but likely to be more difficult than for FLASH memory because the phase-change resistors cannot be accessed directly like the transistors in a FLASH memory. Direct access is not possible when a diode is used to prevent multiple current paths through the cells. A series diode effectively reduces the change in resistance from a factor of 100 to only about a factor of two. FIG. 1 indicates that two-bits-per-cell technology will be possible with OUM.

OUM is scalable because the resistance is determined by the position of the amorphous-crystalline boundary and has atomic-scale granularity. Although the phase-change material must be heated to very high temperature, the small programming volume results in reasonable power dissipation. OUM has a scaling problem in that power per unit area and current density scale inversely with size at constant peak temperature because the temperature gradient scales inversely with size. It is expected that current density will need to be in excess of $10^7$ A/cm$^2$ to heat up a volume that is 10 nm across to 600 C, even with excellent thermal isolation.

Nanoscale copper wires are known to have an electromigration time to failure of a few years at this current density and will quickly be destroyed at $10^8$ A/cm$^2$. See, for example, G. Steinlesberger et al., "Copper Damascene Interconnects for the 65 nm Technology Node: A First Look at the Reliability Properties," IEEE Interconnect Technology Conference Proceedings, p. 265, 2002. Problems of electromigration can probably be avoided by using interconnects having a tall aspect ratio, although local electromigration near the devices could still be a significant problem.

Another issue that may be associated with OUM is the need for bulky transistors for driving large current densities, even though a short-channel length will help alleviate this potential problem. The need for large current density and a diode at each cell for preventing multiple current paths when accessing a cell will make 3-D integration of OUM quite difficult. Polycrystalline silicon diodes fail quickly at current densities of about $10^6$ A/cm$^2$. See, for example, O.-H. Kim et al., "Effects of High-Current Pulses on Polycrystalline Silicon Diode with N-Type Region Heavily Doped with both Boron and Phosphorus," Journal of Applied Physics, vol. 53, p. 5359, 1982. In particular, polycrystalline silicon diodes are only reliable below current densities of about $10^5$ A/cm$^2$. See, for example, U.S. Pat. No. 6,429,449 to F. Gonzalez et al., entitled "Three-Dimensional Container Diode for Use with Multi-State Material in a Non-Volatile Memory Cell".

A diode surface area 100 times larger than the area of the resistor would be required if polycrystalline silicon were used. Additionally, a large number of processing steps would be required to make a tall cylindrically-shaped diode. See, for example, U.S. Pat. No. 6,429,449 to F. Gonzalez et al. Very tall diodes would mean very high aspect ratios for the diodes and for the vias between layers. Even if very large grain size is achieved with a planar diode, a single grain boundary or intra-grain defect can cause a device to fail given the current density needed to write OUM memory.

Wafer bonding techniques used to make Silicon-On-Insulator (SOI) can be used to form diodes in multiple layers if single crystal silicon must be used. See, for example, K. W. Guarini et al., "Electrical Integrity of State-of-the-Art 0.13 μm SOI CMOS Devices and Circuits Transferred for Three-Dimensional (3D) Integrated Circuit (IC) Fabrication," IEDM Tech. Digest (IEEE), p. 943, 2002. To keep costs down, it is advantageous to bond a very thin layer of silicon while reusing the host wafer. One process that appears suitable for making 3-D ICs with single crystal silicon is based on the ELTRAN method that has been developed by Canon. See, for example, K. Sakagushi et al., "Current Progress in Epitaxial Layer Transfer (ELTRAN)," IEICE. Trans. Electron., vol. E80C, p. 378, 1997. According to the ELTRAN method, a host wafer is etched to form a porous layer having very small holes at the surface and large cavities much further down. Epitaxial silicon then bridges the holes to form a new, very high quality surface layer that may undergo the high temperature (>600 C) processing that is needed to form diodes or transistors.

Subsequent steps can be carried out at lower temperature (<600 C) to prevent damage to the 3-D chip. The epitaxial layer is bonded to the 3-D chip and cleaved along the weak porous layer. Alternatively, the epitaxial layer is bonded to a transparent transfer wafer, cleaved, and then transferred to the chip. Etching and chemical-mechanical polishing (CMP) is used for resurfacing the two cleaved planes and the host wafer is reused. Low temperature processing, such as making phase-change resistors, can be performed on the 3-D chip before the next silicon layer is added. The advantage of OUM memory over other similar schemes based on a field-programmable resistor is that current passes in only one direction through the resistor so a diode can be used instead of a transistor for access, thereby reducing the size of the cell and the number of processing steps for each silicon layer. Even though the cost of single crystal silicon is high, 3-D integration should reduce cost more for OUM than for technologies that require a single crystal MOSFET in each cell.

Roughly estimated costs associated with OUM include about $5000 for processing a 300 mm wafer into chips, yielding up to 1000 dies of 70 $mm^2$, each costing about $5. EUV lithography is expected to be expensive at $40 per mask step. See, for example, http://www.sematech.org/public/resources/litho/coo/index.htm. Assuming five masks per layer and three layers, $600 is added to the estimated cost of the wafer. Today SOI wafers are very expensive at over $1000 each with the cost projected to drop to $700 over the next few years. If the cost can continue to drop to about $600, it is projected that three additional layers of silicon will cost about $1800 per 3-D wafer. If another $600 is budgeted for additional processing steps, costs for the masks and costs for testing, the total cost increases 60 percent, but the memory density increases by a factor of four, assuming the bottom layer also has memory cells. According to FIG. 1, OUM may eventually reach an estimated cost that is close to that estimated for HDDs when (1) less expensive SOI techniques (by today's standards) can be used for 3-D integration, (2) multiple bits can be stored per cell, and (3) lithography can be extended down to 10 mm.

MJT-MA and 3D-MRAM

Magnetic Random Access Memory (MRAM) uses one magnetic tunnel junction and one diode (or MOSFET) per cell. The high and low resistance states of a MTJ (i.e., parallel versus anti-parallel magnetic electrodes) are used for storing bits. See, for example, K. Inomata, "Present and Future of Magnetic RAM Technology," IEICE. Trans. Electron., vol. E84-C, p. 740, 2001. Magnetic Tunnel Junction MRAM (MTJ-MRAM) writing is accomplished by passing current through word and bit lines to create a magnetic field that is sufficiently strong to switch the "soft" or "free" magnetic electrode at the cross point of the word and bit lines.

It would be difficult to store more than one bit per cell in MRAM due to the squareness of the MTJ hysteresis loop. One possibility for overcoming this difficulty would be to connect three MTJs in series with each MTJ having a different threshold to store two bits. The complexity and cost of connecting three devices in series for storing twice as much information needs further consideration. For that reason FIG. 1 indicates that MRAM can have only one bit per cell.

A significant obstacle associated with MTJ-MRAM is that the current density necessary for producing a write field scales poorly as the wires are made smaller. The poor scaling is related to a necessary increase in the coercivity of the soft electrode to avoid the superparamagnetism effect. For example, to scale to the 40 nm node, a cube-shaped magnetic bit needs an anisotropy energy of $K_u=50\ k_BT/V=3.5\times10^4$ ergs/$cm^3$. Assuming a magnetization of 1000 emu/$cm^3$, the anisotropy field would need to be $H_k=2K_u/M=70$ Oe. Using the Stoner-Wohlfarth model of magnetic reversal, $H_k$ can be taken to be approximately equal to the field necessary for fast switching. For 40 nm×40 nm bit and word wires (at 45 angular degrees to the magnetic axis) to produce a magnetic field of 70 Oe 40 nm from the wire centers, the current density would need to be at least $j=(5/2^{1/2})H_k/d=6\times10^7$ A/$cm^2$. As discussed above, copper wires will fail after a few years at only $1\times10^7$ A/$cm^2$, so scaling MTJ-MRAM even to 40 nm will require large improvements in the electromigration resistance of copper wires. Consequently, the cost of MRAM will remain quite high in comparison to more scalable technologies.

MRAM does have one interesting advantage for low cost: high current does not need to pass through the cell because writing is accomplished with magnetic fields. During a read operation, a diode may be needed for preventing multiple current paths in the cross-point architecture, but the diode can be made from thin film amorphous silicon. See, for example, P. P. Freitas et al., "Spin Dependent Tunnel Junctions for Memory and Read-Head Applications," IEEE Transactions of Magnetics, vol. 36, p. 2796, 2000. Although a thin film amorphous silicon diode is much cheaper than a single crystal silicon diode, the maximum current density through amorphous silicon is only $10^1$ A/$cm^2$. Accordingly, the very high resistance of a thin film amorphous silicon diode leads to long RC time constants and very low performance.

Cost estimates associated with MJT-MRAMs may be reduced dramatically with 3-D integration. For example, assuming three masks per layer and twelve layers, lithography cost will increase by $1440 per wafer. If an additional $1560 is allowed for other expenses, cost increases by 60 percent, but density increases by a factor of 12. Nevertheless, despite good 3-D potential, MRAM has poor scaling and does not appear competitive with other storage methods.

MATRIX

A MATRIX memory cell has one anti-fuse and one poly-crystalline silicon diode. See, for example, T. H. Lee, "A Vertical Leap for Microchips," Scientific American, vol. 286, p. 52, 2002. MATRIX memory should have 3-D integration costs that are similar to 3-D MRAM with the advantage of being much more scalable. MATRIX memory, currently in development by Matrix Semiconductor, is the most advanced concept for 3-D solid-state memory having chips nearing production and being considered for commercial use. The primary disadvantages of Matrix memory are: (1) the memory is write-once because it is based on destructive breakdown of an insulator, and (2) the memory has low performance because a poly-crystalline silicon diode is used.

1T-FeRAM

A 1T-FeRAM memory cell consists of one MOSFET and one ferroelectric capacitor having a hysteresis loop similar to the exemplary hysteresis loop 200 shown in FIG. 2. 1T-FeRAM memory is very similar to DRAM except that the capacitor dielectric is replaced by ferroelectric material and a slightly different architecture is used. See, for example, O. Auciello et al., "The Physics of Ferroelectric Memories," Physics Today, vol. 51, p. 22, 1998. Use of the ferroelectric material in place of a dielectric material has several advantages, such as (1) the capacitor is non-volatile and does not need to be refreshed, (2) the capacitor can store about 100 times more charge in the same amount of space, and (3) the capacitor is radiation hardened because the polarization of the ferroelectric is not easily affected by radiation.

The quality of having radiation-hardness allows the charge limit associated with a 1T-FeRAM memory cell to be reduced below a million electrons when the sensing method is changed so that current is detected or a gain cell is used. See, for example, D. Takashima, "Overview and Trend of Chain FeRAM Architecture," IEICE. Trans. Electron., vol. E84-C, p. 747, 2001. Consequently, 1T-FeRAM does not suffer from the scaling problems associated with DRAM memory. Even though a ferroelectric material is polycrystalline, it should be capable of scaling to 10 nm. In that regard, it has been calculated that ferroelectric grains of $Pb(Zr, Ti)O_3$ (PZT) as small as 2.5 nm are thermally stable. See, for example, T. Yamamoto, "Calculated Size Dependence of Ferroelectric Properties in $PbZrO_3$—$PbTiO_3$ System," Integrated Ferroelectrics, vol. 12, p. 161, 1996. Additionally, ferroelectric PZT films as thin as 4 nm have been grown. See, for example, T. Tybell et al., "Ferroelectricity in Thin Perovskite Films," Applied Physics Letters, vol. 75, p. 856, 1999. Moreover, low-leakage polycrystalline ferroelectric capacitors as thin as 13 nm have been formed. See, for example, T. Kijima et al., "Si-Substituted Ultrathin Ferroelectric Films," Jpn. J. Appl. Phys., vol. 41, p. L716, 2002. Lastly, lateral ferroelectric domains as small as 6 nm have been switched with scanned probes. See, for example, Y. Cho et al., "Tbit/inch$^2$ Ferroelectric Data Storage Based on Scanning Nonlinear Dielectric Microscopy," Applied Physics Letters, vol. 81, p. 4401, 2002.

If the number of grains or domain wall pinning sites is sufficiently large in a single capacitor, it should be possible to store two or more bits per cell, but this should be difficult because the intermediate state of the cell cannot be verified without destroying the state. For that reason, FIG. 1 indicates that 1T and 0T-FeRAM can scale to 10 nm, but will be limited to only one bit per cell.

Thus, 1T-FeRAM appears to have a good chance of replacing DRAM because of it has similar performance and better scalability. The need for higher dielectric constants has already caused the DRAM industry to extensively investigate perovskite materials.

What is needed is a high-performance non-volatile solid-state memory that scales well and allows for low-cost 3-D integration.

BRIEF SUMMARY OF THE INVENTION

The present invention provides a high-performance non-volatile solid-state memory that scales well and allows for low-cost 3-D integration.

A present invention provides a memory device that includes a plurality of bit lines, a plurality of memory layers, a plurality of tree structures, and a plurality of plate line groups corresponding with at least one memory layer. The plurality of bit lines is formed on a substrate and is arranged substantially in a first plane and extending substantially in a first direction. Each layer of the plurality of layers has an array of memory cells, such as ferroelectric-capacitor memory cells or hysteretic-resistor memory cells. The plurality of tree structures is arranged in a plurality of rows of tree structures and a plurality of tree structures correspond to each bit line. Each tree structure has a trunk portion and at least one branch portion. Each branch portion of a tree structure corresponds to at least one layer. The trunk portion of each tree structure extends from the substrate, each branch portion of a tree structure extends from the trunk portion of the tree structure, and each tree structure corresponds to a plurality of layers. The trunk portion of at least one tree structure includes a plurality of vias that are in line with each other. Alternatively, the trunk portion of at least one tree structure includes a plurality of vias, and at least one via is offset from at least one other via. Each respective plate line group includes a plurality of plate lines that extend in a direction that is substantially perpendicular to the first direction and overlap the branch portion of each tree structure in at least one row of tree structures at a plurality of intersection regions. A memory cell is located at each intersection region in a layer. At least one memory cell can contain ferroelectric material with a pillar-like structure. Alternatively, a plurality of memory cells can be connected by a ferroelectric wire. Alternatively, a plurality of memory cells can be connected by a ferroelectric film. As yet another alternative, at least one memory cell can be a hystereticresistor memory cell. Additionally, each respective plate line group is arranged in a direction that is substantially perpendicular to a direction the branch portion of each tree structure extends.

A plurality of cell layer lines extends substantially in the first direction. A plurality of cell column lines extend in a direction that is substantial perpendicular to the first direction and overlap the plurality of cell layer lines at a plurality of second intersection regions. A plurality of plate-line driver transistors is arranged in a two-dimensional array. Each respective plate-line driver transistor corresponds to and is located at a respective second intersection region. A connection is formed between each plate line and the plate-line driver corresponding to the plate line. Each plate-line driver transistor has a control terminal and the cell column line that corresponds to each plate-line driver transistor is coupled to the control terminal of the plate-line driver transistor. Alternatively, the cell layer line that corresponds to each plate line drive transistor is coupled to the control terminal of the plate-line driver transistor.

The memory device can also includes at least one tree having a plurality of associated memory cells containing a first value and at least one tree having a plurality of associated memory cells containing a second value that is different from the first value. An averaging circuit outputs an average of an output of each tree having a plurality of associated memory cells containing the first value with an output of each tree having a plurality of associated memory cells containing the second value, and a comparator circuit determines an output value of a selected memory cell of the memory device based on the output of the averaging circuit.

In an alternative configuration of the present invention, the memory device includes a plurality of access lines and a plurality of access transistors. The plurality of access lines is formed on the substrate. The access lines extend in a direction that is substantially perpendicular to the first direction and overlap the bit lines at a plurality of second intersection regions. Each second intersection region corresponds to a tree structure, and each access line corresponds to a tree structure row. Each respective access transistor corresponds to and is located at a respective second intersection region. Each respective access transistor is electrically disposed between the tree structure and the bit line corresponding to the second intersection region. Each respective access transistor has a control terminal and is further coupled to the access line corresponding to the second intersection region.

In yet another alternative configuration of the present invention, each access line is a write line and each access transistor is a write transistor. Accordingly, the memory device further includes a plurality of read transistors, a plurality of read lines, and a plurality of gain transistors. The plurality of read transistors are each electrically disposed between a tree structure and the bit line corresponding to the tree structure. The plurality of read lines is formed on the substrate and extends in a direction that is substantially perpendicular to the first direction, thereby overlapping the bit lines at a plurality of third intersection regions. Each third intersection region corresponds to a tree structure, and each read line corresponds to a tree structure row. Each respective read transistor corresponds to and is located at a respective third intersection region. Each respective read transistor is further electrically disposed between the tree structure and the bit line corresponding to the third intersection region. Each respective read transistor has a control terminal and is coupled to the read line corresponding to the third intersection region. Each gain transistor corresponds to a read transistor and is disposed between the read transistor and the tree structure corresponding to the read transistor. Each gain transistor includes a control terminal that is coupled to the corresponding tree structure.

Another embodiment of the present invention provides a memory device having a plurality of bit lines, a three-dimensional memory having a plurality of layers, a plurality of plate line groups, and a plurality of plate-line driver transistors. Each layer of the three-dimensional memory includes an array of memory cells. Each memory cell includes a ferroelectric capacitor. Alternatively, each memory cell can include a hysteretic-resistor memory cell. The plurality of bit lines is formed on a substrate, is arranged substantially in a first plane and extends substantially in a first direction. The plate line groups each include a plurality of plate lines and correspond to at least one layer of the three-dimensional memory. The plurality of plate-line driver transistors is formed on the substrate and is arranged in a two-dimensional array. Each plate-line driver transistor corresponds to a plate line. A plurality of cell layer lines extends substantially in the first direction. A plurality of cell column lines extends in a direction that is substantial perpendicular to the first direction and overlaps the plurality of cell layer lines at a plurality of second intersection regions. Each respective plate-line driver transistor corresponds to and is located at a respective second intersection region. A connection is formed between each plate line and the plate-line driver corresponding to the plate line.

Yet another embodiment of the present provides a method for reading and erasing a memory device that includes a plurality of bit lines, a plurality of layers, a plurality of tree structures, and a plurality of plate line groups corresponding to at least one layer. The plurality of bit lines is formed on a substrate and is arranged substantially in a first plane and extending substantially in a first direction. Each layer of the plurality of layers has an array of ferroelectric capacitor memory cells. The plurality of tree structures is arranged in a plurality of rows of tree structures and a plurality of tree structures correspond to each bit line. Each tree structure has a trunk portion and at least one branch portion. Each branch portion of a tree structure corresponds to at least one layer. The trunk portion of each tree structure extends from the substrate, each branch portion of a tree structure extends from the trunk portion of the tree structure, and each tree structure corresponds to a plurality of layers. The trunk portion of at least one tree structure includes a plurality of vias that are in line with each other. Alternatively, the trunk portion of at least one tree structure includes a plurality of vias, and at least one via is offset from at least one other via. Each respective plate line group includes a plurality of plate lines, extends in a direction that is substantially perpendicular to the first direction and overlaps the branch portion of each tree structure in at least one row of tree structures at a plurality of intersection regions. A ferroelectric capacitor memory cell is located at each intersection region in a layer. Additionally, each respective plate line group is arranged in a direction that is substantially perpendicular to a direction the branch portion of each tree structure extends. According to the invention, each tree structure in the at least one row is allowed to electrically float near a first predetermined voltage. A second predetermined voltage V is applied to a selected plate line. A potential or change in potential of each tree structure in the at least one row is detected and it is determined whether each detected potential or potential change corresponds to a 0 or a 1 for each memory cell at the intersections of the selected plate line and the tree structures in the at least one row. The first predetermined voltage is applied to every tree structure in the at least one row; and the first predetermined voltage is applied to the selected plate line.

Still another embodiment of the present provides a method for reading, erasing, and rewriting a memory device that includes a plurality of bit lines, a plurality of layers, a plurality of tree structures, and a plurality of plate line groups corresponding to at least one layer. The plurality of bit lines is formed on a substrate and is arranged substantially in a first plane and extending substantially in a first direction. Each layer of the plurality of layers has an array of ferroelectric capacitor memory cells. The plurality of tree structures is arranged in a plurality of rows of tree structures and a plurality of tree structures correspond to each bit line. Each tree structure has a trunk portion and at least one branch portion. Each branch portion of a tree structure corresponds to at least one layer. The trunk portion of each tree structure extends from the substrate, each branch portion of a tree structure extends from the trunk portion of the tree structure, and each tree structure corresponds to a plurality of layers. The trunk portion of at least one tree structure includes a plurality of vias that are in line with each other. Alternatively, the trunk portion of at least one tree structure includes a plurality of vias, and at least one via is offset from at least one other via. Each respective plate line group includes a plurality of plate lines, extends in a direction that is substantially perpendicular to the first direction and overlaps the branch portion of each tree structure in at least one row of tree structures at a plurality of intersection regions. A ferroelectric capacitor memory cell is located at each intersection region in a layer. Additionally, each respective plurality of plate lines is arranged in a direction that is substantially perpendicular to a direction the branch portion of each tree structure extends. According to the invention, each tree structure in the at least one row is allowed to electrically float near a first predetermined voltage. A second predetermined voltage V is applied to a selected plate line. A potential or change in potential of each tree structure in the at least one row is detected and it is determined whether each detected potential or potential change corresponds to a 0 or a 1 for each memory cell at the intersections of the selected plate line and the tree structures in the at least one row. The first predetermined voltage is applied to every tree structure in the at least one row; and the first predetermined voltage is applied to the selected plate line. According to the invention, a voltage V/3 is applied to each tree structure in the at least one row of tree structures. A voltage 2V/3 is applied to each plate line in the at least one row of tree structures. Then, a voltage V is applied to a predetermined number of selected tree structures in the at least one row of tree structures. A voltage 0 is applied to a selected plate line where a data "1" will be written in a predetermined number of selected memory cells at the intersection of the first predetermined number of tree structures and the selected plate line. A voltage 2V/3 is applied to the selected plate line and a voltage V/3 is applied to the predetermined number of selected tree structures in the at least one row of tree structures. A voltage 0 is applied to each plate line in the at least one row of tree structures, and a voltage 0 is applied to each tree structure in the at least one row of tree structures.

Another embodiment of the present invention provides a method for reading and erasing a memory device. The memory device includes a plurality of bit lines, a three dimensional memory, a plurality of plate line groups and a plurality of plate-line driver transistors. The plurality of bit lines is formed on a substrate, is arranged substantially in a first plane and extends substantially in a first direction. The three-dimensional memory includes a plurality of layers and a plurality of tree structures. Each layer has a plurality of memory cells and the tree structures are arranged in a plurality of rows. Each tree structure has a trunk portion and at least one branch portion. Each branch portion of a tree structure corresponds to at least one layer, and each branch portion of a tree structure extends from the trunk portion of the tree structure. The plate line groups each include a plurality of plate lines that correspond to at least one layer of the three-dimensional memory. Each respective plate line group overlaps the branch portion of each tree structure in at least one row of tree structures at a plurality of intersection regions. A memory cell, such as a ferroelectric memory cell, is located at each intersection region in a layer. The plurality of plate-line driver transistors is formed on the substrate and is arranged in a two-dimensional array. Each plate-line driver transistor corresponds to a plate line. A plurality of cell layer lines extends substantially in the first direction. A plurality of cell column lines extends in a direction that is substantial perpendicular to the first direction and overlaps the plurality of cell layer lines at a plurality of second intersection regions. Each respective plate-line driver transistor corresponds to and is located at a respective second intersection region. A connection is formed between each plate line and the plate-line driver corresponding to the plate line. According to the invention, each tree structure in at least one row is allowed to electrically float near a first predetermined voltage. A second predetermined voltage V is applied to a selected plate line. A potential or change in potential of each tree structure in the at least one row is detected and it is determined whether each detected potential or potential change corresponds to a 0 or a 1 for each memory cell at the intersections of the selected plate line and the tree structures in the at least one row. The first predetermined voltage is then applied to every tree structure in the at least one row and to the selected plate line.

Another embodiment of the present invention provides a method for writing data to a previously erased memory device. The memory device includes a plurality of bit lines, a three dimensional memory, a plurality of plate line groups and a plurality of plate-line driver transistors. The plurality of bit lines is formed on a substrate, is arranged substantially in a first plane and extends substantially in a first direction. The three-dimensional memory includes a plurality of layers and a plurality of tree structures. Each layer has a plurality of memory cells and the tree structures are arranged in a plurality of rows. Each tree structure has a trunk portion and at least one branch portion. Each branch portion of a tree structure corresponds to at least one layer, and each branch portion of a tree structure extends from the trunk portion of the tree structure. The plate line groups each include a plurality of plate lines and correspond to at least one layer of the three-dimensional memory. Each respective plate line group overlaps the branch portion of each tree structure in at least one row of tree structures at a plurality of intersection regions. A memory cell, such as a ferroelectric memory cell, is located at each intersection region in a layer. The plurality of plate-line driver transistors is formed on the substrate and is arranged in a two-dimensional array. Each plate-line driver transistor corresponds to a plate line. A plurality of cell layer lines extends substantially in the first direction. A plurality of cell column lines extends in a direction that is substantial perpendicular to the first direction and overlaps the plurality of cell layer lines at a plurality of second intersection regions. Each respective plate-line driver transistor corresponds to and is located at a respective second intersection region. A connection is formed between each plate line and the plate-line driver corresponding to the plate line. According to the present invention, a voltage V/3 is applied to each tree structure in at least one row of tree structures. A voltage 2V/3 is applied to each plate line in the at least one row of tree structures. A voltage V is applied to a predetermined number of selected tree structures in the at least one row of tree structures. A voltage 0 is applied to a selected plate line where a data "1" will be written in a predetermined number of selected memory cells at the intersection of the first predetermined number of tree structures and the selected plate line. A voltage 2V/3 is applied to the selected plate line. A voltage V/3 is applied to the predetermined number of selected tree structures in the at least one row of tree structures. A voltage 0 is applied to each plate line in the at least one row of tree structures, and to each tree structure in the at least one row of tree structures.

BRIEF DESCRIPTION OF THE DRAWINGS

The present invention is illustrated by way of example and not by limitation in the accompanying figures in which like reference numerals indicate similar elements and in which:

FIG. 1 shows a table setting forth estimated performance characteristics and estimated costs at the limits of scaling for current and potential solid-state memory technologies, as projected for the year 2020;

DETAILED DESCRIPTION OF THE INVENTION

Figure 2:
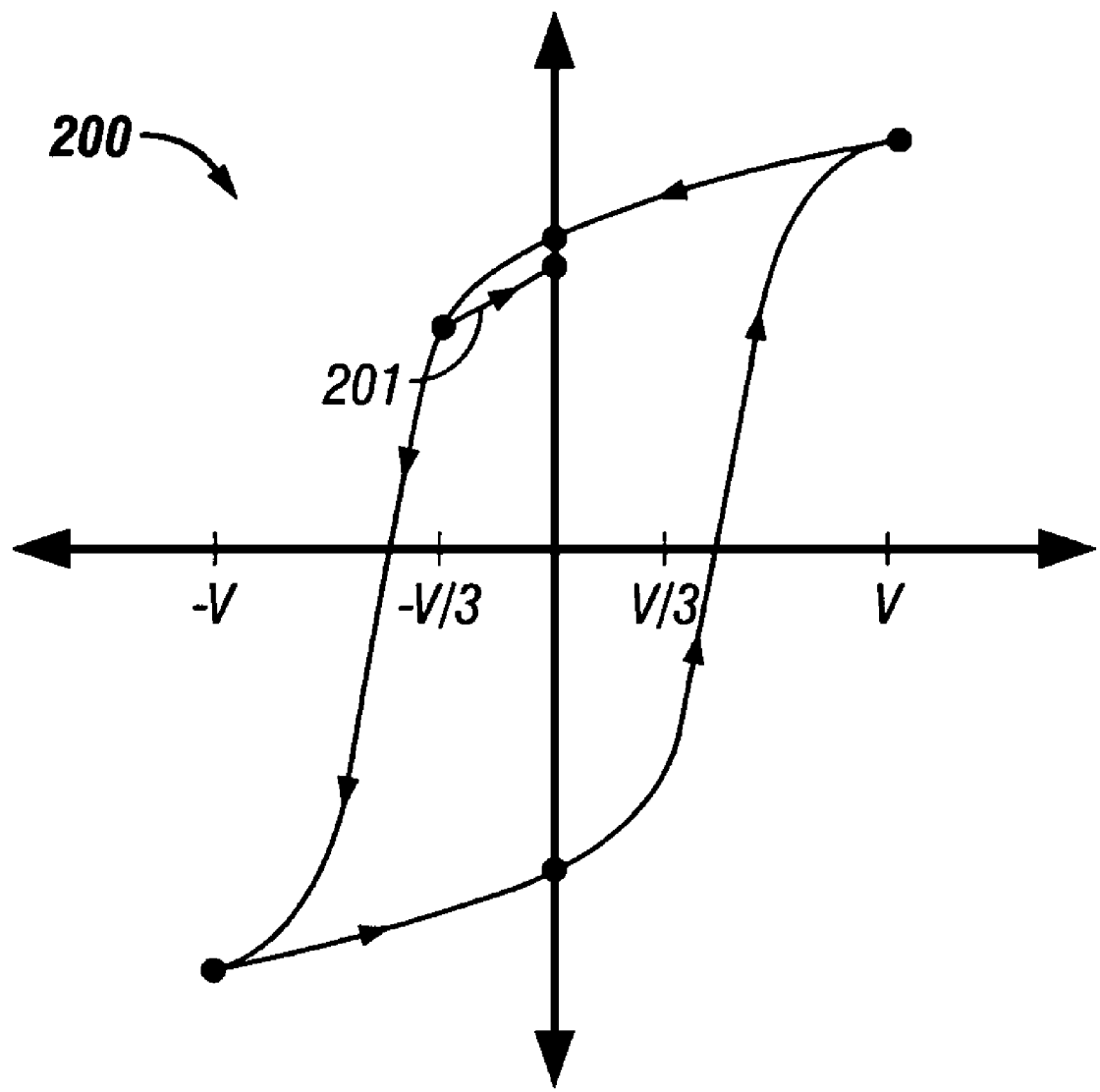
FIG. 2 shows an exemplary hysteresis loop for illustrating characteristics of FeRAM-based memory cells.

The present invention relates to an ultra-low-cost, scalable, nonvolatile solid-state memory having a very high density, a high performance, and very low power dissipation. In particular, the present invention relates to a three-dimensional (3-D) arrangement of 0T-FeRAM memory cells, in which each memory cell includes a ferroelectric capacitor. The memory cells are arranged in a tree-like structure with cross-point access being through the base of the tree and through plate-lines threading at least one row of trees. The trees have built-in sense gain and cell disturbance is managed by sequential access within a tree row. Multiple layers of ferroelectric capacitors are built on top of a single active silicon layer containing access transistors, gain transistors, sense circuitry, and a two-dimensional array of plate-line drivers. The architecture is designed to have the lowest possible fabrication cost with memory layers comprising only ferroelectric material between crossed wires. Due to the special arrangement for one embodiment of the present invention, the same three masks may be repeatedly used for defining all memory layers and the total number of mask steps is about 3N+1, in which N is the number of layers. Other embodiments of the present invention require fewer mask steps.

3-D integration of 0T-FeRAM is readily achievable because the memory layer of a memory cell is formed by a ferroelectric material between crossed wires. See, for example, T. Nishihara et al., "A Quasi-Matrix Ferroelectric Memory for Future Silicon Storage," IEEE Journal of Solid-State Circuits, vol. 37, p. 1479, 2002. Such a configuration is no more complicated than conventional back-end processing performed for microprocessors in which there are typically eight levels of wiring built on top of the transistors of the microprocessor. Moreover, ferroelectric materials can be grown at temperatures below 600 C making ferroelectric materials suitable for back-end processing.

A 3-D memory based on 0T-FeRAM has been previously disclosed by T. Nishihara et al., supra. As disclosed, each layer of memory was connected to the bottom silicon layer through a separate via, resulting in a large amount of space being consumed by the vias. Thus, data density was decreased while cost was increased. Separate vias also increase mask complexity requiring different masks for defining common electrodes and vias in every layer, therefore greatly increasing mask costs. Layer selector transistors were also used for individually accessing each layer. The transistors occupied valuable silicon real estate and could increase the minimum sector size that can be individually accessed without disturbance problems. When the number of cells connected by disturbance is larger, the energy required to write is larger because more plate lines must be energized during the write process.

Plate lines in the Nishihara et al. memory device were connected between layers in the same column, thereby complicating a reading process. Moreover, because no timing diagram was disclosed, it was not clear as to how data was intended to be read. One potential approach could be to switch a plate line high and sequentially read each bit connected to a plate line by turning on each unit transistor. Besides being complicated, there is the danger of cross talk and disturbance occurring during the readout because voltages on common electrodes in a layer could couple through the capacitors to the plate lines connecting the different layers.

According to one embodiment of the present invention, each layer of 0T-FeRAM memory can be fabricated using only three masks. If EUV lithography is used having an estimated cost of $40 per mask step per wafer, 16 layers would add an estimated $1920 to the $5000 price per wafer. This is likely to be the dominant cost adder. If an additional $1080 is added for other processing and testing costs, then the estimated cost of the chip increases by 60 percent, but the memory density increases by a factor of 16. This results in a cost per bit that is ten times lower than a 2-D memory structure. According to another embodiment of the present invention, 16 layers of memory could be fabricated with as few as 27 mask steps and the cost per bit could be significantly lower. Also, because of the simple, self-aligning 3-D structure of the embodiments of the present invention, it is possible that less expensive lithography may be used such as imprint lithography.

A 0T-FeRAM memory cell is the simplest of all solid-state storage methods in FIG. 1, having only a single capacitor per cell. Current does not pass through the cell for either writing or reading so no other circuit elements are needed in the cell for steering current. The idea of a simple cross-bar of ferroelectric capacitors was popular in the early days of FeRAM but was abandoned because of disturbance issues. See, for example, O. Auciello et al., supra. Disturbances occur when voltages are applied to bit lines and word lines for accessing a cross point. Smaller voltages may be inadvertently applied across unselected capacitors, thereby causing an unselected cell to pass through a minor polarization loop, as shown by 201 in FIG. 2, and lose polarization. This problem can be reduced by using improved ferroelectric materials that have better hysteresis loop squareness. MRAM writing is accomplished by a half-select scheme in which half the select field is provided by the bit line and half from the word line. Half-selected cells do not usually switch in MRAM because magnetic materials have very square hysteresis loops.

Another way to reduce disturbances is to limit the number of cells that are disturbed and rewrite a cell each time the cell is disturbed. In practice, the data is read and rewritten sequentially until all the data that have been linked by disturbance are read. Similar to DRAM, a FeRAM read operation is destructive and the read data must, in any event, be rewritten. See, for example, T. Nishihara et al., "A Quasi-Matrix Ferroelectric Memory for Future Silicon Storage," IEEE Journal of Solid-State Circuits, vol. 37, p. 1479, 2002, and U.S. Pat. No. 6,301,145 to T. Nishihara, entitled "Ferroelectric Memory and Method for Accessing Same."

Data is read in "sectors" and byte access is not available, similar to HDD and FLASH memories. The maximum number of disturbance pulses is limited to the number of cells connected together when the starting cell is always the same, or is limited to about twice the number of connected cells when the starting cell is random (to gain faster access to a particular byte of data).

Figure 3:
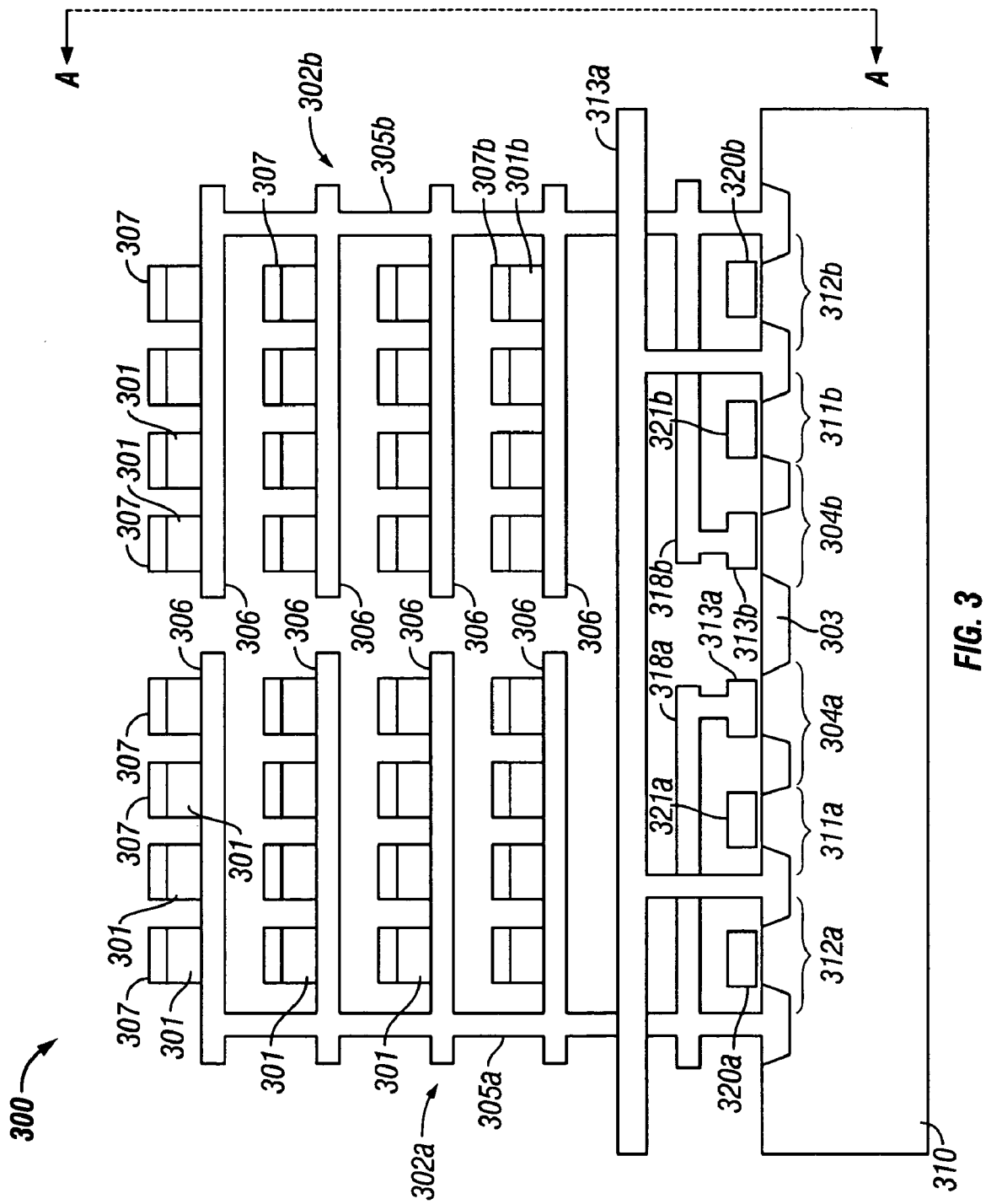
FIG. 3 shows a cross-sectional view of a first exemplary arrangement of a first embodiment of a 3-D 0T-FeRAM memory according to the present invention, as viewed along line B-B shown in FIG. 4.
Figure 4:
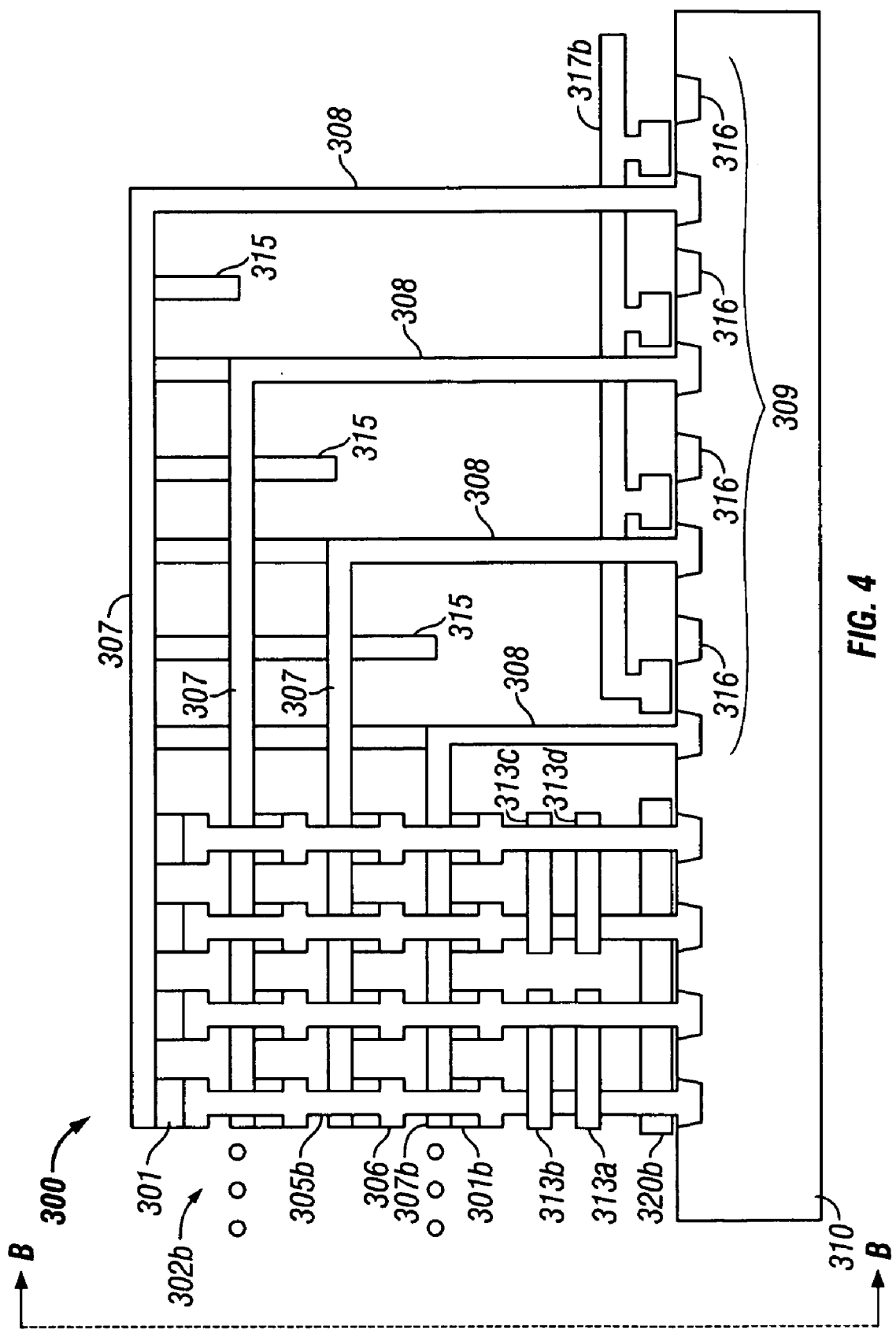
FIG. 4 shows a cross-sectional view of the exemplary 3-D 0T-FeRAM memory shown in FIG. 3, as viewed along line A-A in FIG. 3.

FIG. 3 shows a cross-sectional view of a first exemplary arrangement of a first embodiment of a 3-D 0T-FeRAM memory 300 according to the present invention, as viewed along line B-B, which is shown in FIG. 4. Specifically, FIG. 3 is a cross-sectional view showing details of the end of two rows of trees. FIG. 4 shows a cross-sectional view of the first exemplary arrangement of 3-D 0T-FeRAM memory 300 as viewed along line A-A in FIG. 3. Specifically, FIG. 4 is a cross-sectional view of memory 300 showing details of plate lines through a row of trees.

Memory 300 includes a plurality of memory cells 301 that are each formed from a single ferroelectric capacitor and that are arranged in a tree-like structure, referred to herein as a "memory tree." Not all memory cells 301 are indicated for simplification of FIGS. 3 and 4.

Two memory trees 302a and 302b are shown in FIG. 3. Memory trees 302a and 302b are arranged to be mirror images of each other so that a common voltage line 303 can be shared for gain transistors 304a and 304b. Gain transistors 304a and 304b and read transistors 311a and 311b are used to convert a voltage on a tree structure into a current on a bit line for improved detection sensitivity. As best viewed in FIG. 3, each memory tree 302 includes a base or "trunk" portion 305 that is formed from a conductive material, such as platinum, and a plurality of "branch" portions 306 that are also formed from a conductive material, such as platinum. In FIG. 3, each branch portion 306 forms a layer of memory 300. Memory cells 301 are arranged along branches 306. As shown in FIG. 3, the trunk portion 305 is a series of vias between layers used to connect to branch portions 306 in a plurality of layers. For each of the embodiments of the present invention, the vias forming the trunk portion can be displaced relative to one another in different layers without changing the operation of the invention as long as the memory cells in a plurality of layers are connected by a conducting path. Therefore, the tree can have a variety of possible shapes. As best viewed in FIG. 4, plate lines 307 are formed to thread between branches 306. Each plate line 307 connects to a row of memory cells 301, thereby forming a 3-D cross-point array. Cross-point access to a particular memory cell 301 is through a trunk portion 305 and branch portion 306 and a plate-line 307 corresponding to the memory cell. A via 308 connects each plate line of a row of trees to a 2-D array of plate-line driver transistors 309.

Although only four layers are shown in FIGS. 3 and 4, at least 16 layers can be added to a tree structure by simply adding each additional layer to the top of the tree. Each additional layer increases the effective memory density.

Multiple layers of storage cells are built on top of a single active silicon layer 310, which contains gain transistors 304a and 304b, read transistors 311a and 311b, write transistors 312a and 312b, and the 2-D array of plate-line drivers 309. Each tree 302a and 302b has built-in sense gain by respectively connecting trunk portions 305a and 305b to gates 318a and 318b of gain MOSFETs 304a and 304b through conductive branches 314a and 314b. The potential of the memory tree is measured by turning on a read transistor 311 during a read operation and measuring the current flowing on bit line 313a, which connects to multiple rows of trees. A write transistor 312 is used to place voltages on a memory tree during a write operation. Cell disturbance is managed by sequential access within a tree row. That is, data is read and written by accessing each plate line in a serial manner until all memory cells in a row of trees are accessed.

The same three masks may be used repeatedly for defining all memory layers of the first embodiment of the present invention. This is depicted in FIG. 4, which shows a side view of the end of a row of trees where plate lines 307 are connected to the 2-D array of plate-line drivers 309. One mask is used to make memory tree branches 306. One mask is used to make plate lines 307, and one mask make is used to make vias 308. The plate line mask and the via mask can be offset in each layer to make connections to plate-line drivers 309. Thus, plate lines 307 are made slightly offset at each higher layer of the memory tree. Offsetting of the via mask for each higher layer creates extra partial vias 315 that do not adversely affect operation of memory 300. Offsetting masks also causes partial trees at the opposite end of the row of trees, but these partial trees do not adversely affect operation of memory 300 with proper design of the lower non-repeated layers. Alternatively, different masks may be used for each layer so that extra vias 315 and partial trees do not occur.

Plate-line driver transistors 309 form a 2-D array and are addressed by a plurality of cell layer lines 316 and a plurality of cell column lines 317. FIG. 4 also shows bit lines 313a-313d, while FIG. 3 only shows bit line 313a for clarity. Bit lines 313a-313d are arranged to snake through trunks 305 at two different levels so that trees 302 can be as close together as possible.

Figure 8:
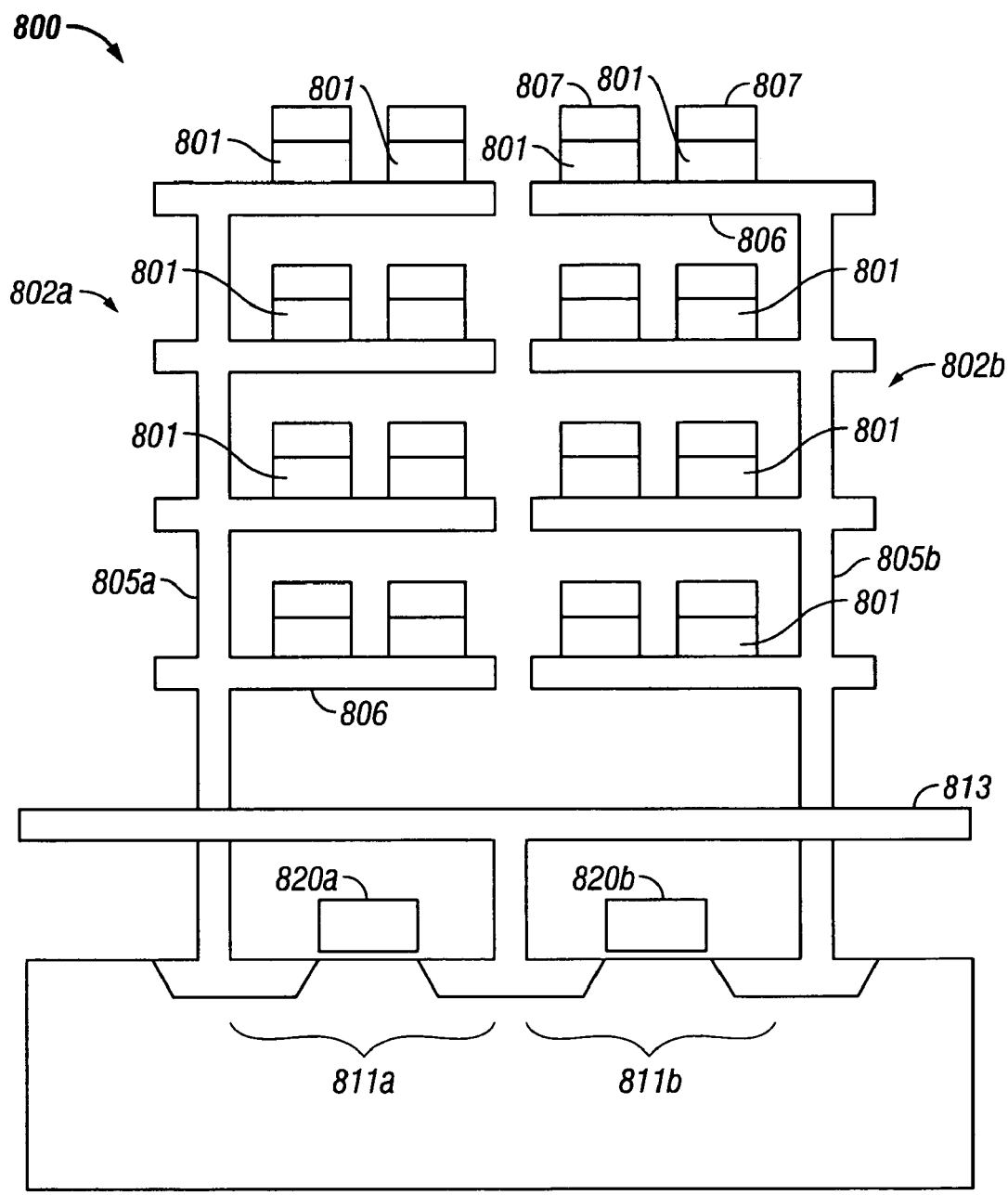
FIG. 8 shows a cross-sectional view of an alternative exemplary arrangement of the first embodiment of a 3-D 0T-FeRAM memory according to the present invention.

FIG. 8 shows a cross-sectional view of a second exemplary arrangement of the first embodiment of a 3-D 0T-FeRAM memory according to the present invention. Memory 800 includes a plurality of ferroelectric capacitor memory cells 801 that are arranged in a memory tree. Not all memory cells 801 are indicated for simplification of FIG. 8. Two memory trees 802a and 802b are shown in FIG. 8. Memory trees 802a and 802b are shown as mirror images of each other, but do not necessary need to be. Each memory tree 802 includes a trunk portion 805 that is formed from a conductive material, such as platinum, and a plurality of branch portions 806 that are also formed from a conductive material, such as platinum. Each branch portion 806 forms a layer of memory 800. Memory cells 801 are arranged along branches 806. As shown in FIG. 8, trunk portions 805 are a series of vias between layers used to connect to branch portions 806 in a plurality of layers. Similar to memory 300 shown in FIGS. 3 and 4, the vias forming trunk portions 805 can be displaced relative to one another in different layers without changing the operation of the invention as long as memory cells 801 in a plurality of layers are connected by a conducting path. Consequently, each tree structure 805 can have a variety of possible shapes. Plate lines 807 are formed to thread between branches 806 of other tree structures that are not shown in FIG. 8. Although only four layers are shown in FIG. 8, at least 16 layers can be added to a tree structure by simply adding each additional layer to the top of the tree.

The arrangement of memory 800 differs from the arrangement of memory 300, shown in FIGS. 3 and 4, by not having a gain transistor for improving memory cell detection sensitivity, and by not having separate read and write lines. Instead, memory 800 includes an access line 820 that is used for accessing a particular memory cell 801 through an access transistor 811 and a bit line 813 for both reading and writing operations.

Figure 5:
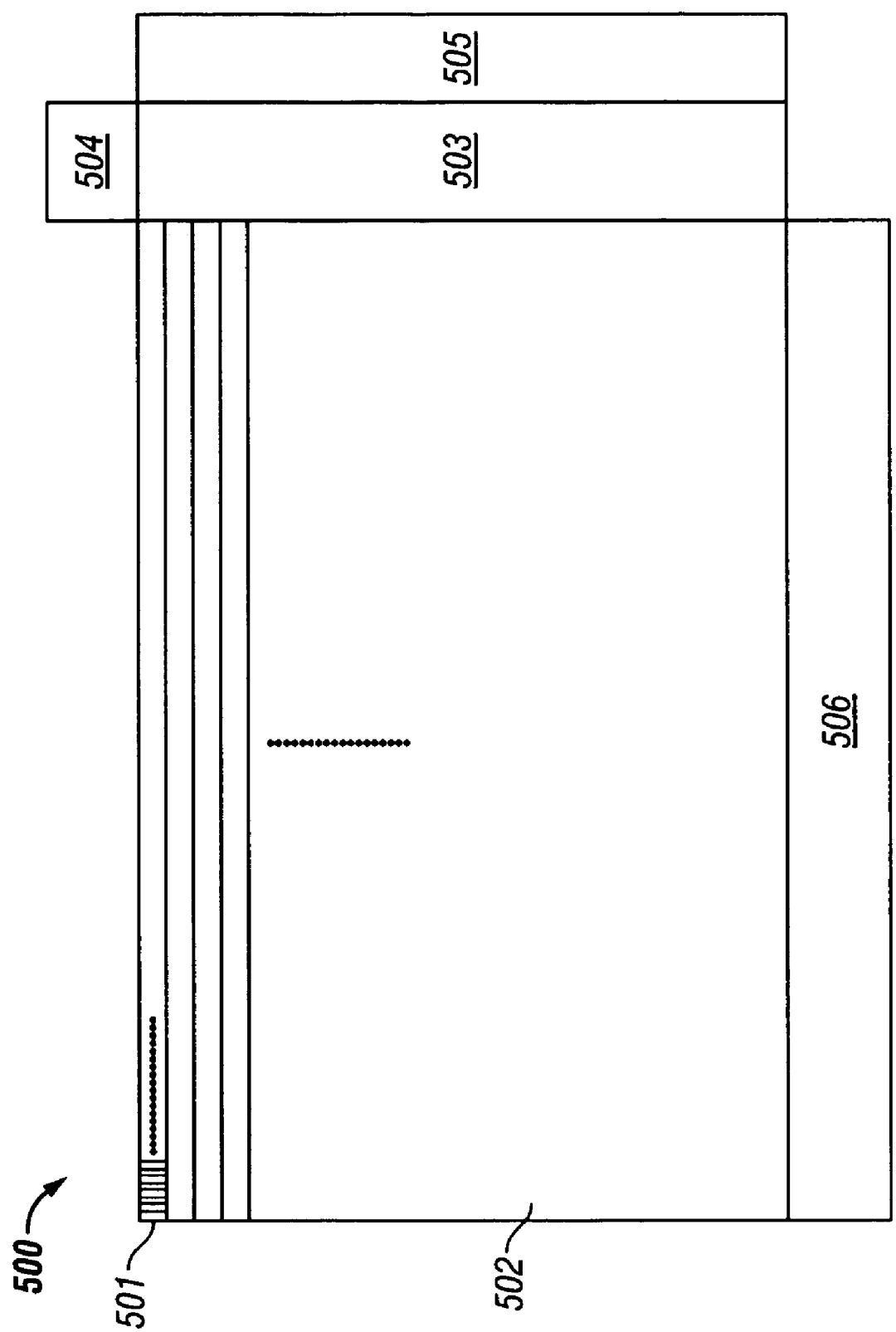
FIG. 5 depicts an overall chip layout of the exemplary memory shown in FIGS. 3 and 4.

FIG. 5 depicts an overall chip layout 500 of exemplary memory 300. A large number of trees, for example as many as 1024, are lined up to form a tree row 501. A plurality of tree rows 501 are arranged in a tree array portion 502 of chip layout 500. An array 503 of plate-line driver transistors 309 is located at one end of the tree rows. The plate-line driver transistors 309 are selected using cell layer lines 316, which are driven by cell layer line drivers located in cell layer driver array portion 504, and by cell column lines 317, which are driven by cell column drivers located in cell column and read/write driver array portion 505. Each row of trees has its own write line 320 and read line 321, which are respectively driven by write and read drivers that are also located in cell column and read/write driver array portion 505. Note that the connections from the write line 320 and read line 321 to the read/write driver array are not shown in FIG. 4 for the sake of simplicity. Also note that the write and read drivers may also be located on the left edge of the tree array portion 502 of chip layout 500. Bit lines 313 thread through a large number of tree rows, for example, as many as 128 rows, and are driven by bit line drivers and sense amplifiers driver array 506, which is located at the end of bit lines 313.

Figure 6:
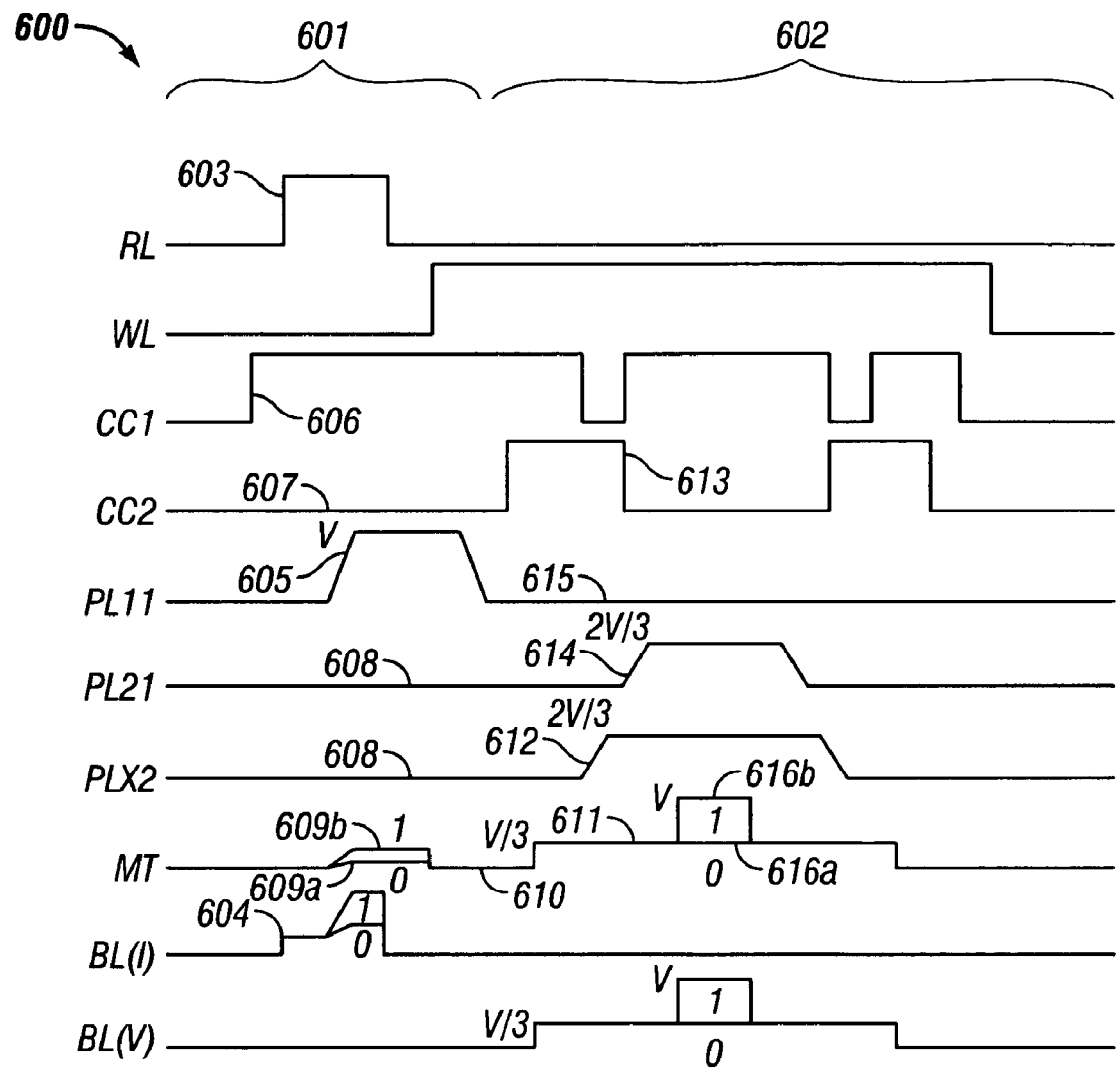
FIG. 6 shows a timing diagram illustrating a first read operation for a reading memory cell of a 3-D 0T-FeRAM memory according to the present invention.

FIG. 6 shows a timing diagram illustrating a first read operation 600 for reading memory cell 301*b* of 3-D 0T-FeRAM memory 300 shown in FIGS. 3-5. A read operation 600 is divided into a read phase 601 and a write-back phase 602. A V/3 disturbance sequence and a sequential access sequence in a sector are used for preventing disturbance-related problems.

During read phase 601, a read line (RL), such as read line 321*b* (FIG. 3) shown in FIG. 3, is turned on at 603 causing an offset current to flow on bit line (BL), such as bit line 313*a*, at 604. At 606, a cell column select line (CC1), such as cell column select line 317*b*, is turned on. At 605, a voltage V is applied to one of the cell layer lines through the plate-line driver and onto one of the plate lines (PL11), such as plate line 307*b*, to write 0 on all storage cells in the tree row connected to that plate line. (The notation PL11 indicates the plate line physically located at layer 1 in column 1, i.e., towards the lower right corner of FIG. 3.) The other cell column transistors (CC2) (indicated at 607) must be off to prevent the other plate lines in the selected layer, such as PL12, from going high to voltage V. Plate lines PLX2 in column 2, in which "X" indicates any layer, are also floating, as shown at 608.

When selected memory cell 301*b* contains a "0", a small amount of charge is placed on the memory tree (MT) 302*b* at 609*a*, causing the voltage of memory tree 302*b* to rise a small amount. In contrast, when the memory cell 302*b* contains a "1", the polarization switches and a larger amount of charge is placed on memory tree 302*b* at 609*b*, thereby causing a larger change in potential and a larger change in the conductance of gain transistor 304*b*. Sense amplifiers (not shown) that are connected to bit line 313*a* sense whether the bit line current or change in bit line current is large enough to be a "1" based on known "0"s and "1"s located in extra sample trees (not shown). The result is stored by the sense amplifiers for write back phase 602. All bits along the selected plate line (for example, a total of 1024 bits) are detected simultaneously. Next during read phase 601, a "0" is reinforced by discharging memory tree 302*b* at 610.

Write-back phase 602 begins by bringing all of the memory trees 302 in a tree row to V/3, as shown at 611. At this point, all of the plate lines 306 in non-accessed columns are brought to 2V/3 (PLX2) at 612. The other cell column transistors CC2 are then turned off at 613 and PL21 is brought to 2V/3 at 614, while PL11 is kept at 0 (615). When memory cell 301*b* contained a "0", memory tree 302*b* is kept at V/3 at 616*a*. When memory cell 301*b* contained a "1", a voltage V is applied to memory tree 302*b* (at 616*b*). All memory cells on a plate line (for example, 1024 bits) are written simultaneously. Disturbance voltages are kept to a maximum of V/3. Nevertheless, because PLX2 is floating while the memory trees are pulsed, capacitive coupling could possibly increase the potentials on the plate lines. Consequently, the disturbance voltage difference could be greater than V/3 in memory trees that are kept at V/3.

Figure 7:
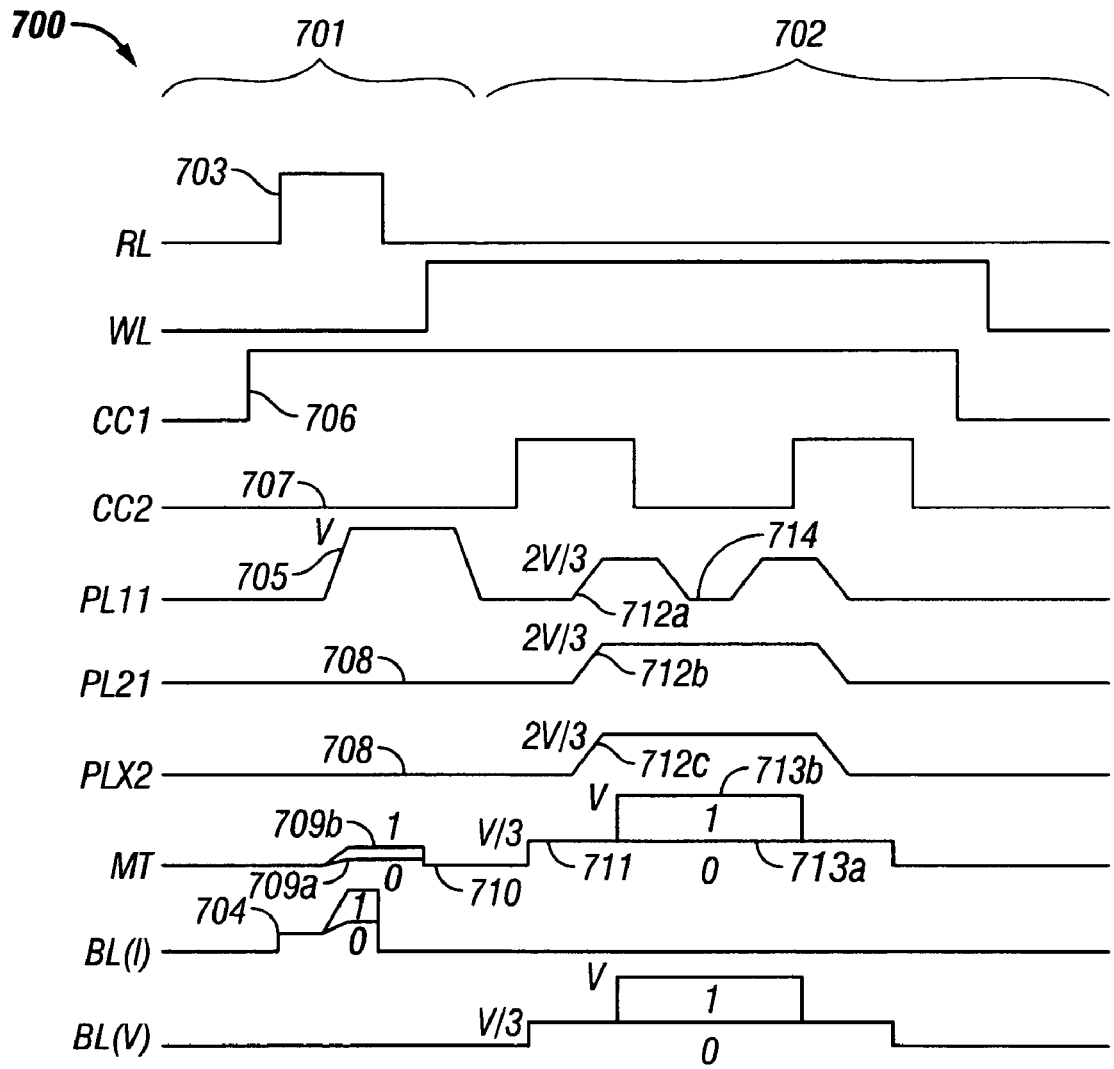
FIG. 7 shows a timing diagram illustrating a second, alternative read operation for reading a memory cell of a 3-D 0T-FeRAM memory according to the present invention.

FIG. 7 shows a timing diagram illustrating a second, alternative preferred read operation 700 for reading memory cell 301*b* of 3-D 0T-FeRAM memory 300 shown in FIGS. 3-5. Read operation 700 also includes a read phase 701 and a write-back phase 702. Read phase 701 is identical to read phase 601, shown in FIG. 6, and is labeled similarly. The beginning of write-back phase 702 is similar to write-back phase 602 by bringing all of the memory trees 302 in a tree row to V/3, as shown at 711. Afterward, all plate lines 307 are brought to 2V/3, shown at 712*a*, 712*b* and 712*c*. At 713*b*, the memory trees 302 in the tree row are then brought to either V when memory cell 301*b* contained a "1", or left at V/3 when memory cell 301*b* contained a "0" at 713*a*. At 714, the plate line 307*b* is pulsed to 0. Even though plate lines PLX2s are floating during the pulse, they are not affected because the memory trees are not floating or changing potential. Again, all memory cells on plate line 307*b* (for example, a total of 1024 bits) are written simultaneously.

The same process is repeated for the next plate line, regardless whether the read operation of FIG. 6 or FIG. 7 is used, until all plate lines in a tree row are read and written. When data is to be written, only the write-back phase of either FIG. 6 or FIG. 7 is used, thereby omitting the read phase of the operation. Operation of memory 800 (FIG. 8) is shown by the timing diagrams shown in FIGS. 6 and 7, with the BL(V) output being equal to signal MT in both Figures. Signal BL(I) would not appear for memory 800. Also, the access transistor is turned on for both the read and write operations and the memory tree voltage (MT) is passed to the bit line voltage (BL) for both the read and write operations.

In reference to memory 800, it is possible that the memory cells 801 are not simple ferroelectric capacitors. Rather than having a hysteretic polarization loop with electric field (as in FIG. 2), the memory cell may have a hysteretic resistance with electric field. That is, application of a voltage across the device in one direction leads to a high resistance and application of a voltage in the other direction leads to a low resistance. One example of this type of device is described in W. W. Zhuang et al., "Novell Colossal Magnetoresistive Thin Film Nonvolatile Resistance Random Access Memory (RRAM)," IEDM Tech. Digest (IEEE), p. 193 (2002). With hysteretic resistance memory and using the architecture shown in FIG. 8, data may be read by applying a smaller, nondestructive voltage to the plate line at 605 or 705 (replace V with a smaller voltage V* in FIG. 6 or FIG. 7). Because resistance measurement of a cell is desired, the state of the cell is determined now by the current that flows to the bit line rather than the voltage and there is no need for a gain transistor. Accordingly, the timing diagram for reading would look like what is shown in FIG. 6 or FIG. 7, except that MT would look like BL(V) and BL(I) would look the same as is shown. Also, the access transistor would be turned on for both read and write operations. This would be the case if, for example, the detection circuit held the bit line and memory tree at virtual ground while current was detected. For resistance memory, there exists the possibility of offset current flowing from the memory tree back to any of the other plate lines in the tree when there is any potential difference between the tree and any of the plate lines. Therefore, it is important that the offset voltages from the detection circuit and the offset voltages from the circuitry that puts "ground" on the non-accessed plate lines in the memory tree are as small as possible. The architecture shown in FIG. 8 is ideal for this type of memory because no diode or transistor is needed for every cell and the number of leakage paths is minimized (for example, seven leakage paths in FIG. 8). Those skilled in the art will also recognize that the detection circuit could also measure the leakage current before voltage V* is applied to the plate line, store the measured leakage current, and subtract the leakage current from the signal although this would complicate the detection circuitry significantly. The write sequence could be the same as for ferroelectric memory. That is, memory cells along a plate line are first erased and then a "1" is written in some cells using the sequence shown in FIG. 6 or FIG. 7.

Hysteretic-resistor memory may have some advantages over ferroelectric memory. First, reading is nondestructive so that data is not erased and does not have to be rewritten after the data is read. Second, intermediate values of resistance could be written. For example, with the appropriate write voltages, one of four different values of resistance could be stored to represent "00", "01", "10", and "11" and two bits of information could be stored in each memory cell. This would lower the cost per bit by about a factor of two. For this type of memory, it is desirable to have a fairly high resistance even in the low resistance state and keep current density through each cell lower than about $10^4$ A/cm$^2$ so that current can be supplied to a large number of memory trees in a row simultaneously through the plate line without electromigration problems in the plate line and also avoid significant voltage drops along the plate line.

For a memory tree arrangement having four cells per branch, 16 layers and with 1024 trees in a row, the minimum data sector size is 8 KB. The maximum number of disturbances is 64 for a sequential-access operation, or 127 when the starting plate line is randomly selected. Disturbance conditions do not occur in other tree rows that are not being accessed.

The performance characteristics of memory 300 can be estimated for copper interconnects (i.e., plate lines with a copper core), and a memory cell having a ferroelectric capacitor, such as disclosed by T. Kijima et al., supra. For this example, the thickness of the ferroelectric capacitor is s=13 nm, polarization P=20 μC/cm$^2$, and dielectric constant ∈=200. The voltage difference on the memory tree between "1" and "0" when one capacitor switches is given by V=2Ps/N∈∈$_0$, in which N is the number of capacitors in the tree. When N=64, the voltage difference V is 46 mV. Assuming a 60 mV/decade transistor sub-threshold slope, the conductance of the gain transistor changes by a factor of six. Thus, the signal output from the gain transistor is large enough to be easily detectable.

The speed of memory 300 is determined by plate line capacitance rather than ferroelectric switching time. For example, the switching time of perovskites materials is much less than 1 ns. The capacitance of the plate line will be dominated by the large dielectric constant and capacitance of the ferroelectric material. If no capacitors are switching, the capacitance is C=M∈∈$_0$ A/s, in which M is the number of capacitors on the plate line and A is the area of each capacitor (ignoring edge effects). If the capacitors are taken to be 11 nm in size and M=1024, then C=17 fF. If the switching voltage is taken to be 0.5 V, then the effective switching capacitance of each capacitor will be 2PA/V=0.1 fF. Consequently, if half of the capacitors switch, the effective plate line capacitance will be 50 fF. If the maximum current density is taken to be $10^7$ A/cm$^2$, then the maximum current though a 22×11 nm wire will be 24 μA. Thus, the slew-rate-limited plate line rise time is CV/I=1 ns when half of the capacitors switch and 2 ns in the worst case when all of the capacitors switch.

The resistivity of copper wires at the nanoscale increases due to interface scattering, so the resistivity is taken as ρ=5 μΩ-cm. The resistance of a 22×11 nm copper wire is 5 kΩ for a length of 22 μm. The RC time constant is 0.2 ns, so read and write times will be dominated by the plate-line slew rate when capacitors are switching. Thus, the minimum time to read a particular byte of data is a little longer than 2 ns, which is an access time that is about 1 million times faster than a HDD. This estimate also assumes that the sense amplifiers are fast in comparison to the plate line rise time. Referring to the timing diagram of FIG. 7, there are two plate line swings that cause switching (with up to 100 fF of capacitance) and four that do not (with 17 fF of capacitance) during a full read/write cycle. In FIG. 1, the minimum read access time is taken to be 5 ns and the minimum write time to be 10 ns. Consequently, the read/write cycle time is 15 ns for one plate line and 1 μs for 8 KB of data. This means that the data rate is 8 GB/s for one tree array on a chip that may also operate many arrays in parallel for even higher data rates.

Power requirements can be calculated based on CV$^2$ with capacitance C being dominated by plate line swings, particularly during the write cycle in which all plate lines must be brought to 2V/3 and back to 0 for reduced disturbance effects. If ferroelectric materials can be improved, all plate lines other than PL11 (FIGS. 6 and 7) could be kept at V/2 throughout the read/write cycle resulting in even better power efficiency because only the active plate line and the memory trees would need to be charged. Speed would also be higher, but disturbance voltages would be V/2 instead of V/3. Power requirements could also be reduced by using a ferroelectric material having a lower dielectric constant.

Even with the timing shown in FIG. 7, power requirements are much lower than any other type of memory listed in FIG. 1. For example, assuming 64 plate lines and adding up the CV$^2$ energy for each plate line swing and memory tree swing, 0.5 pJ are required to read and write 1024 bits in 15 ns, which corresponds to 35 μW for 8 GB/s. This compares favorably to a HDD, which can supply a data rate of 200 MB/s with about 10 W of power. Thus, 0T-FeRAM could be on the order of 10 million times more energy efficient than a HDD.

In contrast to the power requirements for the present invention, the current density through an OUM cell must be about $10^7$ A/cm$^2$ to heat up a nanoscale volume to 600 C, while for reading, the current density is perhaps half this amount. For an OUM cell having a cross section of 11 nm×11 nm, the current requirements are 12 µA. The voltage across the diode and phase change cell is about 1.5 V, so the power dissipation is 18 µW. Because it takes at least 50 ns to write, the amount of energy required for OUM for a one bit write is 1 pJ. For multi-bit OUM, multiple pulses may be required to program and the total time would accordingly be longer. Thus, 0T-FeRAM writing is 2000 times more energy efficient than for OUM in this example.

Figure 9:
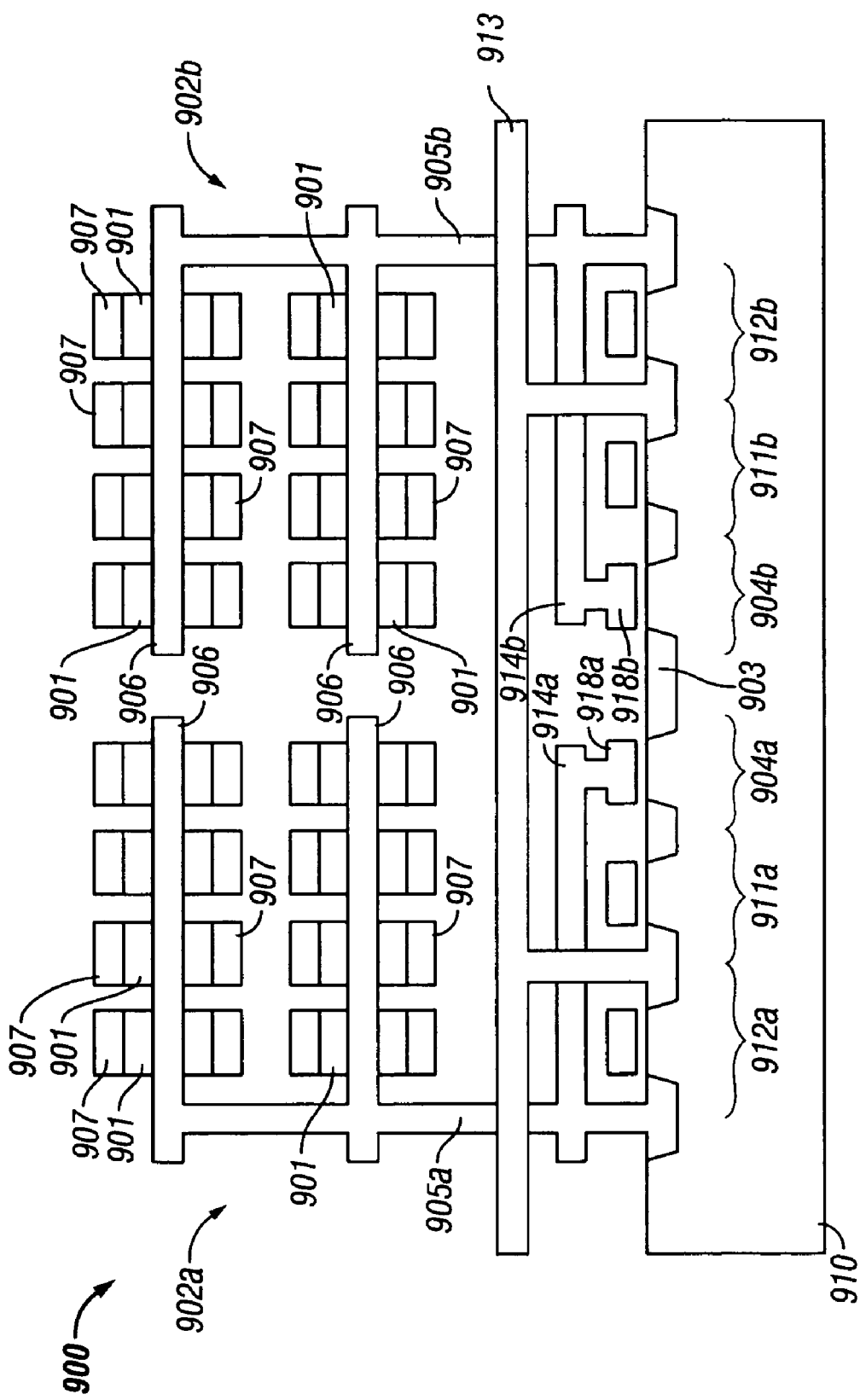
FIG. 9 shows a cross-sectional view of an exemplary arrangement of a second embodiment of a 3-D 0T-FeRAM memory according to the present invention.

FIG. 9 shows a cross-sectional view of an exemplary arrangement of a second embodiment of a 3-D 0T-FeRAM memory 900 according to the present invention. In particular, FIG. 9 is a cross-sectional view showing details of the end of two rows of trees. Memory 900 includes a plurality of memory cells 901 that are each formed from a single ferroelectric capacitor and that are arranged in a memory-tree structure. Not all memory cells 901 are indicated for simplification of FIG. 9. Two memory trees 902a and 902b are arranged to be mirror images of each other so that a common voltage line 903 can be shared for gain transistors 904a and 904b. Gain transistors 904 and read transistors 911 are used for converting a voltage on a tree structure into a current on a bit line for improved detection sensitivity. Each memory tree 902 includes a trunk portion 905 that is formed from a conductive material, such as platinum, and a plurality of branch portions 906 that are also formed from a conductive material, such as platinum. Each branch portion 906 is formed between two layers of memory cells 901. That is, memory cells 901 are arranged above and below each branch portion 906 so that one branch portion 906 is connected to two layers of memory cells 901. Similar to trunk portions 305 of memory 300, trunk portions 905 are a series of vias between layers that are used to connect to branch portions 906 and can have a variety of possible shapes. Cross-point access to a particular memory cell 901 is through a trunk portion 905 and branch portion 906 and a plate-line 907 corresponding to the memory cell.

Multiple layers of storage cells are built on top of a single active silicon layer 910, which contains gain transistors 904a and 904b, read transistors 911a and 911b, write transistors 912a and 912b, and a 2-D array of plate-line drivers (not shown). Each tree 902a and 902b has built-in sense gain by respectively connecting trunk portions 905a and 905b to gates 918a and 918b of gain MOSFETs 904a and 904b through conductive branches 914a and 914b. The potential of the memory tree is measured by turning on a read transistor 911 during a read operation and measuring the current flowing on bit line 913a, which connects to multiple rows of trees. A write transistor 912 is used to place voltages on a memory tree during a write operation. Cell disturbance is managed by sequential access within a tree row. That is, data is read and written by accessing each plate line in a serial manner until all memory cells in a row of trees are accessed.

The first exemplary arrangement the first embodiment of a memory 300, shown in FIG. 3, requires 3N+1 masks, in which N is the number of memory layers. For each layer, one mask is used for the tree branch, one mask is used for the plate line and one mask is used for the plate line via at the end of the tree rows. Additionally, one mask must be used after all layers are built to create the vias for a trunk portion 305. In contrast, the second embodiment of a memory according to the present invention, shown in FIG. 9, requires 5N/2+1 masks because there are only half the number of tree branches.

Figure 10:
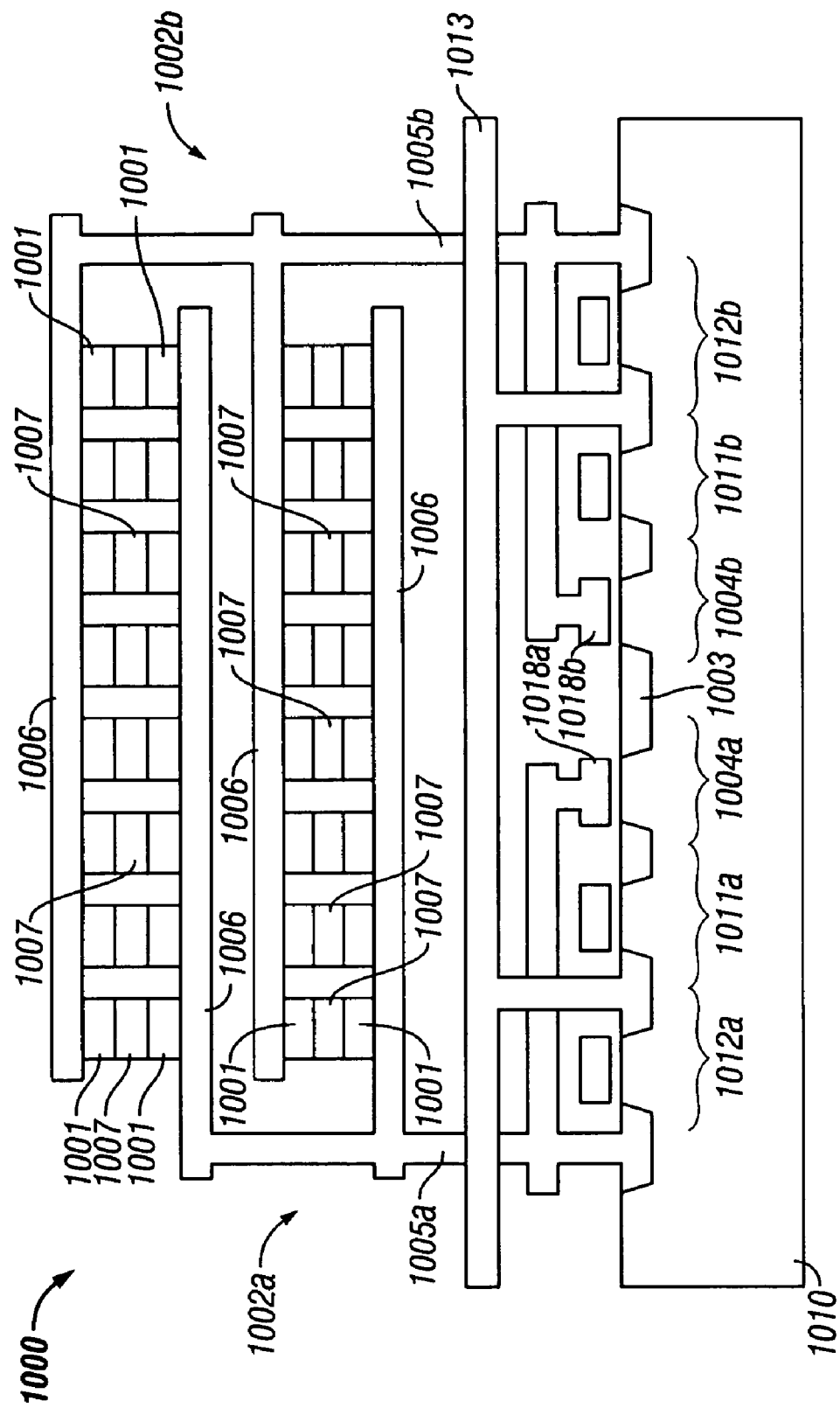
FIG. 10 shows a cross-sectional view of an exemplary arrangement of a third embodiment of a 3-D 0T-FeRAM memory according to the present invention.

FIG. 10 shows a cross-sectional view of an exemplary arrangement of a third embodiment of a 3-D 0T-FeRAM memory 1000 according to the present invention. In particular, FIG. 10 is a cross-sectional view showing details of the end of two rows of trees. Memory 1000 includes a plurality of memory cells 1001 that are each formed from a single ferroelectric capacitor and that are arranged in a memory-tree structure. Not all memory cells 1001 are indicated for simplification of FIG. 10. Two memory trees 1002a and 1002b are arranged to be near mirror images of each other so that a common voltage line 1003 can be shared for gain transistors 1004a and 1004b. Gain transistors 1004 and read transistors 1011 are used for converting a voltage on a tree structure into a current on a bit line for improved detection sensitivity. Each memory tree 1002 includes a trunk portion 1005 that is formed from a conductive material, such as platinum, and a plurality of branch portions 1006 that are also formed from a conductive material, such as platinum. Memory cells 1001 are arranged above and below plate lines 1007 so that plate lines 1007 connect to a branch portion 1006 of two different trees. The physical arrangement of memory cells 1001, branch portions 1006 and plate lines 1007 requires that only half of the number plate lines and plate-line drivers are needed in comparison to the first embodiment of the present invention, shown in FIG. 3. The physical arrangement of memory cells 1001, branch portions 1006 and plate lines 1007 of the third embodiment of the present invention also causes data to be simultaneously placed on two different trees when a plate line 1007 is pulsed. Data from the two trees can be passed to the bit line in serial fashion (or separate bit lines can be used in parallel). Voltages may be written on the two different trees in a serial fashion.

Trunk portions 1005 are a series of vias between layers that are used to connect to branch portions 1006 and can have a variety of possible shapes. Cross-point access to a particular memory cell 1001 is through a trunk portion 1005 and branch portion 1006 and a plate-line 1007 corresponding to the memory cell.

Multiple layers of storage cells are built on top of a single active silicon layer 1010, which contains gain transistors 1004a and 1004b, read transistors 1011a and 1011b, write transistors 1012a and 1012b, and a 2-D array of plate-line drivers (not shown). Each tree 1002a and 1002b has built-in sense gain by respectively connecting trunk portions 1005a and 1005b to gates 1018a and 1018b of gain MOSFETs 1004a and 1004b through conductive branches 1014a and 1014b. The potential of the memory tree is measured by turning on a read transistor 1011 during a read operation and measuring the current flowing on bit line 1013a, which connects to multiple rows of trees. A write transistor 1012 is used to place voltages on a memory tree during a write operation. Cell disturbance is managed by sequential access within a tree double row. That is, data is read and written by accessing each plate line in a serial manner until all memory cells in the double row of trees are accessed.

In comparison to the first embodiment of a memory 300, the peripheral area needed for plate-line drivers is reduced by a factor of two for the arrangement of the third embodiment of the present invention because a single plate line connects to two branch portions. Additionally, the number of masks that is required is only 2N+2.

Figure 11:
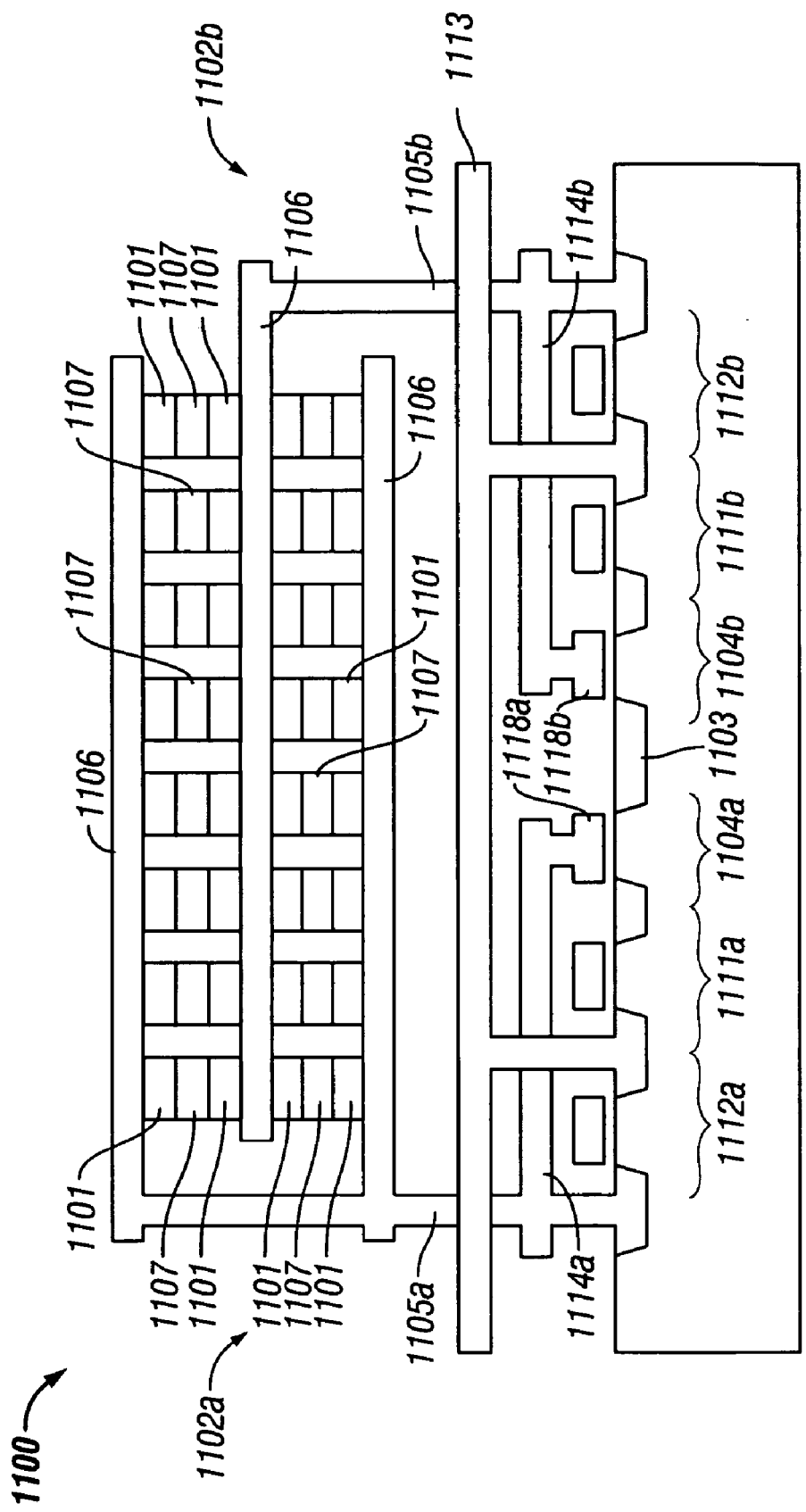
FIG. 11 shows a cross-sectional view of an exemplary arrangement of a fourth embodiment of a 3-D 0T-FeRAM memory according to the present invention.

FIG. 11 shows a cross-sectional view of an exemplary arrangement of a fourth embodiment of a 3-D 0T-FeRAM memory 1100 according to the present invention. In particular, FIG. 11 is a cross-sectional view showing details of the end of two rows of trees. Memory 1100 includes a plurality of memory cells 1101 that are each formed from a single ferroelectric capacitor and that are arranged in a memory-tree structure. Not all memory cells 1101 are indicated for simplification of FIG. 11. Two memory trees 1102a and 1102b are arranged to be near mirror images of each other so that a common voltage line 1103 can be shared for gain transistors 1104a and 1104b. Gain transistors 1104 and read transistors 1111 are used for converting a voltage on a tree structure into a current on a bit line for improved detection sensitivity. Each memory tree 1102 includes a trunk portion 1105 that is formed from a conductive material, such as platinum, and a plurality of branch portions 1106 that are also formed from a conductive material, such as platinum. Memory cells 1101, branch portions 1106 and plate lines 1107 are arranged so that plate lines 1107 and inner branch 1106 connect to two memory cells 1101. The physical arrangement of memory cells 1101, branch portions 1106 and plate lines 1107 requires that only half of the number plate lines and plate-line drivers are needed in comparison to the first embodiment of the present invention, shown in FIG. 3. The physical arrangement of memory cells 1101, branch portions 1106 and plate lines 1107 of the fourth embodiment of a 3-D 0T-FeRAM memory also causes data to be simultaneously placed on two different trees when a plate line 1107 is pulsed. Data from the two trees can be passed to the bit line in serial fashion (or separate bit lines can be used in parallel). Voltages may be written on the two different trees in a serial fashion.

Trunk portions 1105 are a series of vias between layers that are used to connect to branch portions 1106 and can have a variety of possible shapes. Cross-point access to a particular memory cell 1101 is through a trunk portion 1105 and branch portion 1106 and a plate-line 1107 corresponding to the memory cell.

Multiple layers of storage cells are built on top of a single active silicon layer 1110, which contains gain transistors 1104a and 1104b, read transistors 1111a and 1111b, write transistors 1112a and 1112b, and a 2-D array of plate-line drivers (not shown). Each tree 1102a and 1102b has built-in sense gain by respectively connecting trunk portions 1105a and 1105b to gates 1118a and 1118b of gain MOSFETs 1104a and 1104b through conductive branches 1114a and 1114b. The potential of the memory tree is measured by turning on a read transistor 1111 during a read operation and measuring the current flowing on bit line 1113a, which connects to multiple rows of trees. A write transistor 1112 is used to place voltages on a memory tree during a write operation. Cell disturbance is managed by sequential access within a tree double row. That is, data is read and written by accessing each plate line in a serial manner until all memory cells in the double row of trees are accessed.

The number of masks that are required for the fourth embodiment of the present invention is only 3N/2+3. Consequently, for large N, the number of masks is only about half the number of masks that are required for the first embodiment of the present invention. Thus, for a given number of masks, the fourth embodiment of the present invention has twice the number of capacitors and twice the number of bits for about half the cost per bit in comparison to the first embodiment of the present invention. For example, 16 layers of memory according to the fourth embodiment of the present invention can be created using only 27 mask steps.

While only four layers are shown in each of FIGS. 9-11, at least 16 layers can be added to each embodiment of the present invention shown in FIGS. 9-11 by simply adding each additional layer to the top of a tree. Each additional layer accordingly increases the effective memory density. Also, the arrangement of memory cells shown in each of FIGS. 9-11 applies equally well to either ferroelectric memory cells or hysteretic-resistor memory cells. Because a gain transistor is not needed in the case of hysteretic-resistor memory cells, the silicon layer electronics could be the same as is shown in FIG. 8.

Figure 12:
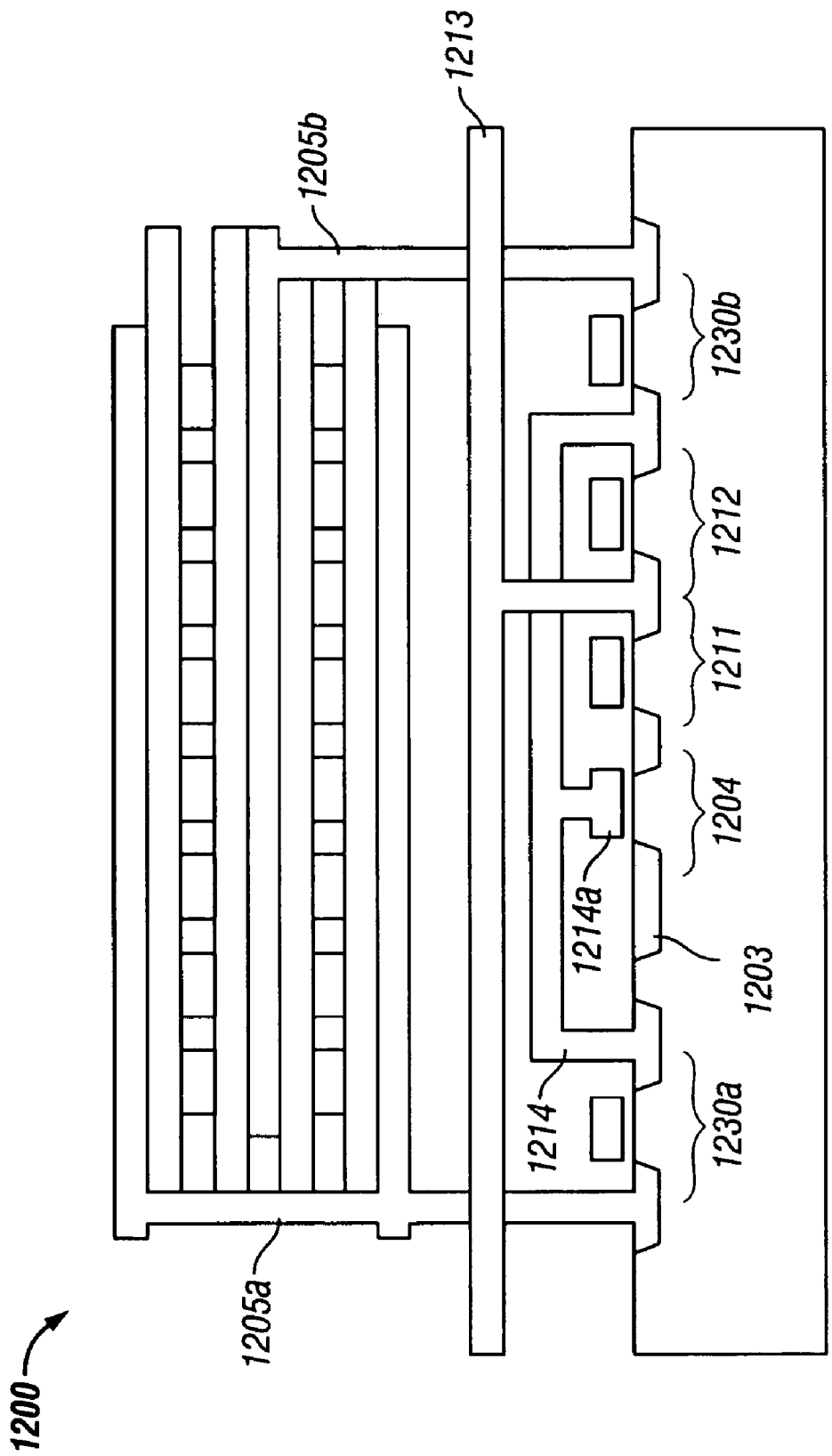
FIG. 12 shows a cross-sectional view of an exemplary alternative arrangement of active components in the substrate below a 3-D memory according to the present invention.

FIG. 12 shows a cross-sectional view of an exemplary alternative arrangement 1200 of active components in the substrate below a 3-D memory according to the present invention. Alternative arrangement 1200 has one fewer transistor than any of the arrangements shown in FIGS. 3 and 9-11. In particular, unit transistors 1230a and 1230b respectively connect tree portions 1205a and 1205b to conductive branch 1214 when selected. Conductive branch 1214 is connected to gate 1214a of a gain transistor 1204. Gain transistor 1204 connects a common voltage line 1203 to a read transistor 1211 during a read operation, which, in turn, is connected to a bit line 1213. Write transistor 1212 connects bit line 1213 to conductive branch 1214 during a write operation.

Traditional 1T-1C ferroelectric memories typically have large cell areas that are caused by difficulty in achieving a steep capacitor sidewall during etching and by damage to the ferroelectric material caused during etching. Consequently, planar capacitors are used having a large trapezoidal shape, thereby increasing cell size. Additionally, etching of ferroelectric material results in a loss of polarization. Further still, a dedicated mask is used when a capacitor is etched. To avoid using a dedicated mask for a capacitor in a cross-point memory, the present invention provides that the ferroelectric material can be etched using the same mask that is used when the branch portions and/or plate lines are etched.

Figure 13:
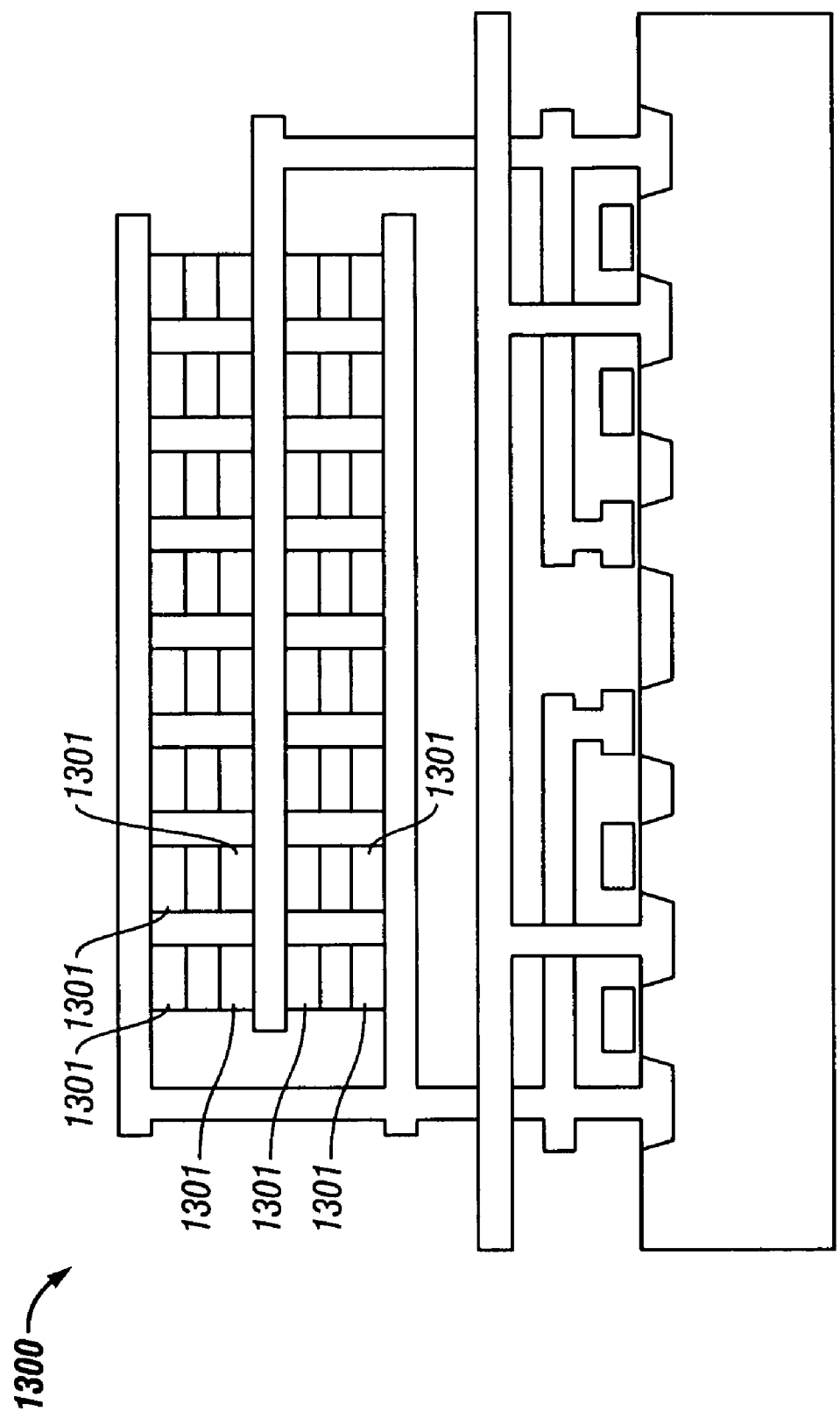
FIG. 13 depicts ferroelectric memory cells formed by a first technique according to the present invention.

According to the present invention, capacitors are formed by first depositing one or more full films of conductors and a full film of ferroelectric (perhaps also with a thin protective layer on top). Then, a branch is defined using a mask step and an etch step. This results in a multi-layered wire having a ferroelectric material as part of the wire. Subsequently, the "valleys" between memory cells 1201 are filled with a dielectric material, such as silicon dioxide, and a chemical-mechanical polishing (CMP) step is used for planarizing the wafer. At this point, the protective layer may be removed. Another set of conducting films, which will become plate lines, and full film of ferroelectric material are then applied. Another protection layer can be deposited on top of the ferroelectric material, and a second mask is used to define the first plate line. According to a first technique for forming ferroelectric memory cells according to the present invention, the second etch goes down all the way through the first ferroelectric layer so that the first ferroelectric layer is etched a second time to form memory cells having a pillar-like structure, as depicted by memory cells 1301 in FIG. 13. Not all memory cells 1301 are indicated for simplification of FIG. 13. The process is repeated so that each ferroelectric layer is etched twice to form memory cells having a pillar-like structure without using a dedicated mask.

Figure 14:
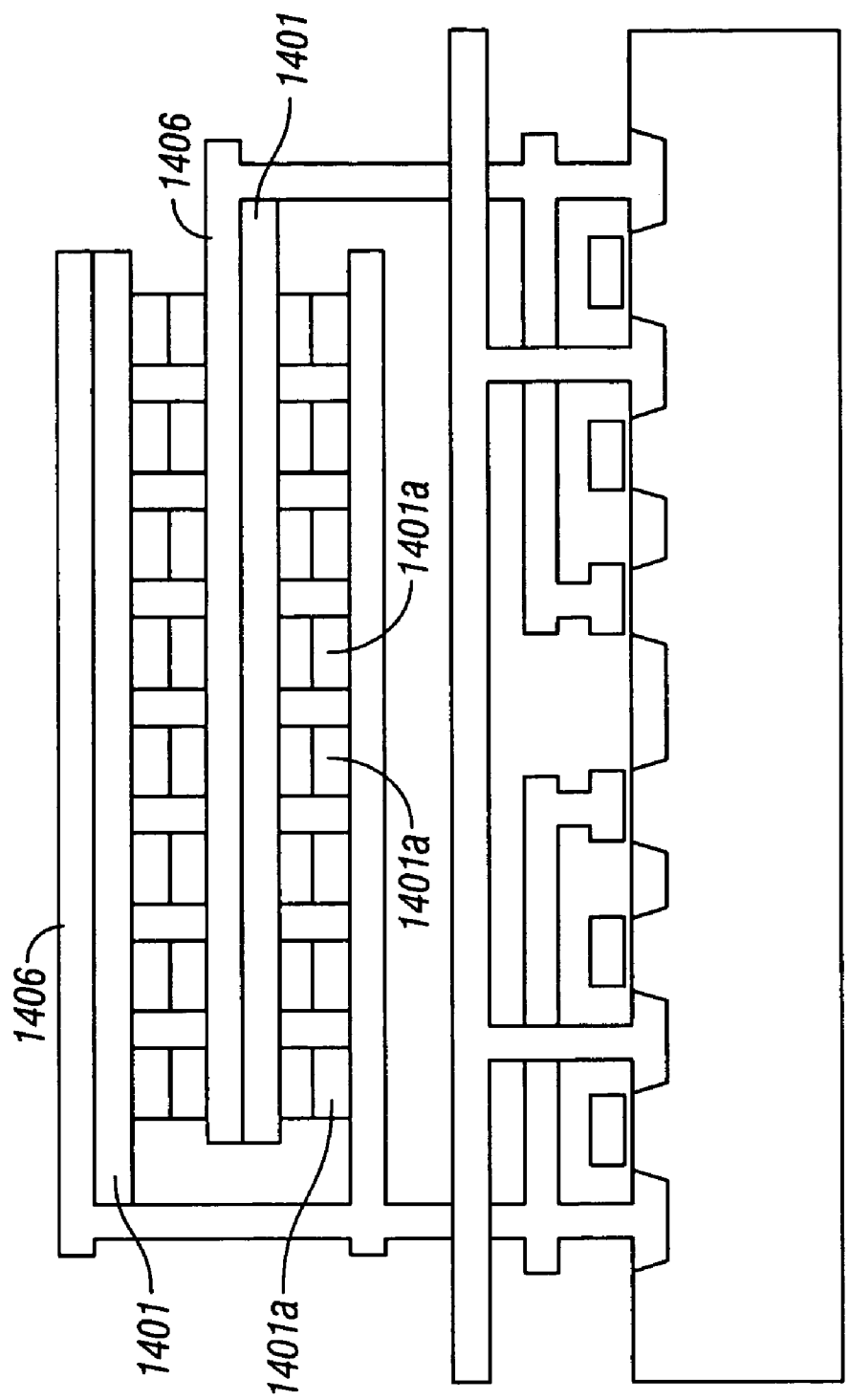
FIG. 14 depicts ferroelectric memory cells formed by a second technique according to the present invention.

One very useful feature of cross-point memory is that it is not necessary to form pillars, thereby avoiding the problems associated with traditional 1T-1C memory. For example, FIG. 14 shows an arrangement of a 3-D memory in which the ferroelectric material is etched only once into the wire shape at the same time that the metal layer above it is etched, thereby further reducing the difficulties with etching. In FIG. 14, ferroelectric material 1401 and branch portions 1406 are formed as wires using one etching mask and ferroelectric material 1401a and plate line portions are formed as wires using one etching mask.

Figure 15:
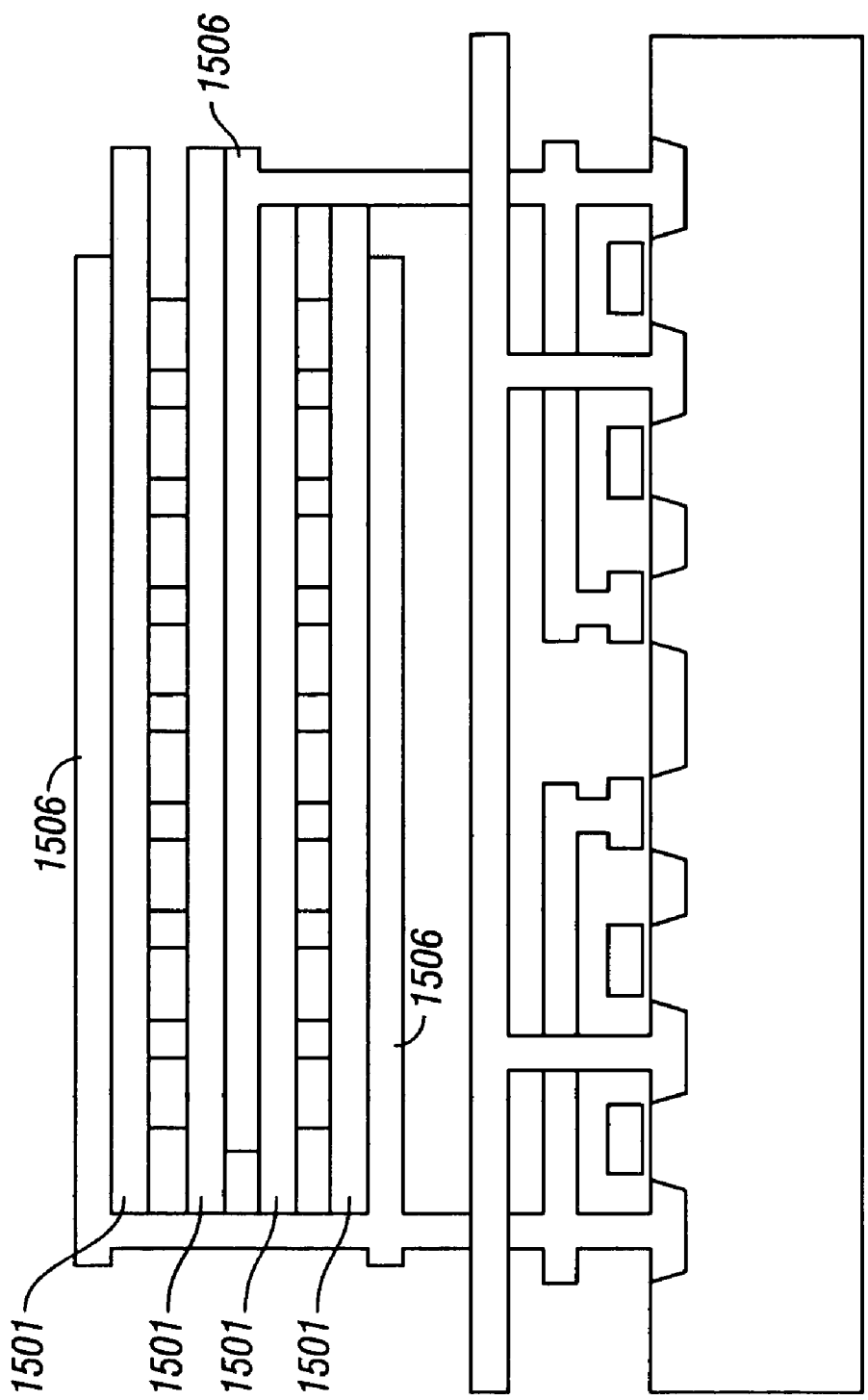
FIG. 15 depicts ferroelectric memory cells formed by a third technique according to the present invention.

The concept of reducing the etching of the ferroelectric material layer can be extended, as shown by FIG. 15, which is the simplest arrangement having no ferroelectric etching at all. In FIG. 15, branch portions 1506 are formed as wires using one etching mask. Subsequently, the "valleys" between branch portions 1506 are filled with a dielectric material such as $SiO_2$ and a chemical-mechanical polishing (CMP) step is used for planarizing the wafer. Then, a full film of ferroelectric material and metal are deposited and the metal is etched to form the plate lines without significant etching of the ferroelectric layer. The arrangement shown in FIG. 15 avoids all problems with ferroelectric etching so that scaling to nanometer dimensions is more readily attainable.

As described above, the output signal of a selected memory cell can be determined by comparing the output signal to the output of reference memory cells containing 0's and 1's. According to the present invention, each row of trees contains at least one tree in which all of the memory cells store 0's and at least one tree in which all of the memory cells store 1's. During a read phase, a selected plate line corresponding to a selected memory cell is brought high, thereby switching the polarization of each memory cell along the selected plate line and changing the potential of each respective tree structure along the selected plate line. When a memory cell contains a 1, for example, the voltage on the corresponding tree structure changes accordingly. The conductance of a gain transistor corresponding to a tree structure changes depending on the voltage on the tree structure. A current flows on a corresponding bit line that is a function on whether the capacitor of a memory cell contained a 0 or a 1.

Figure 16:
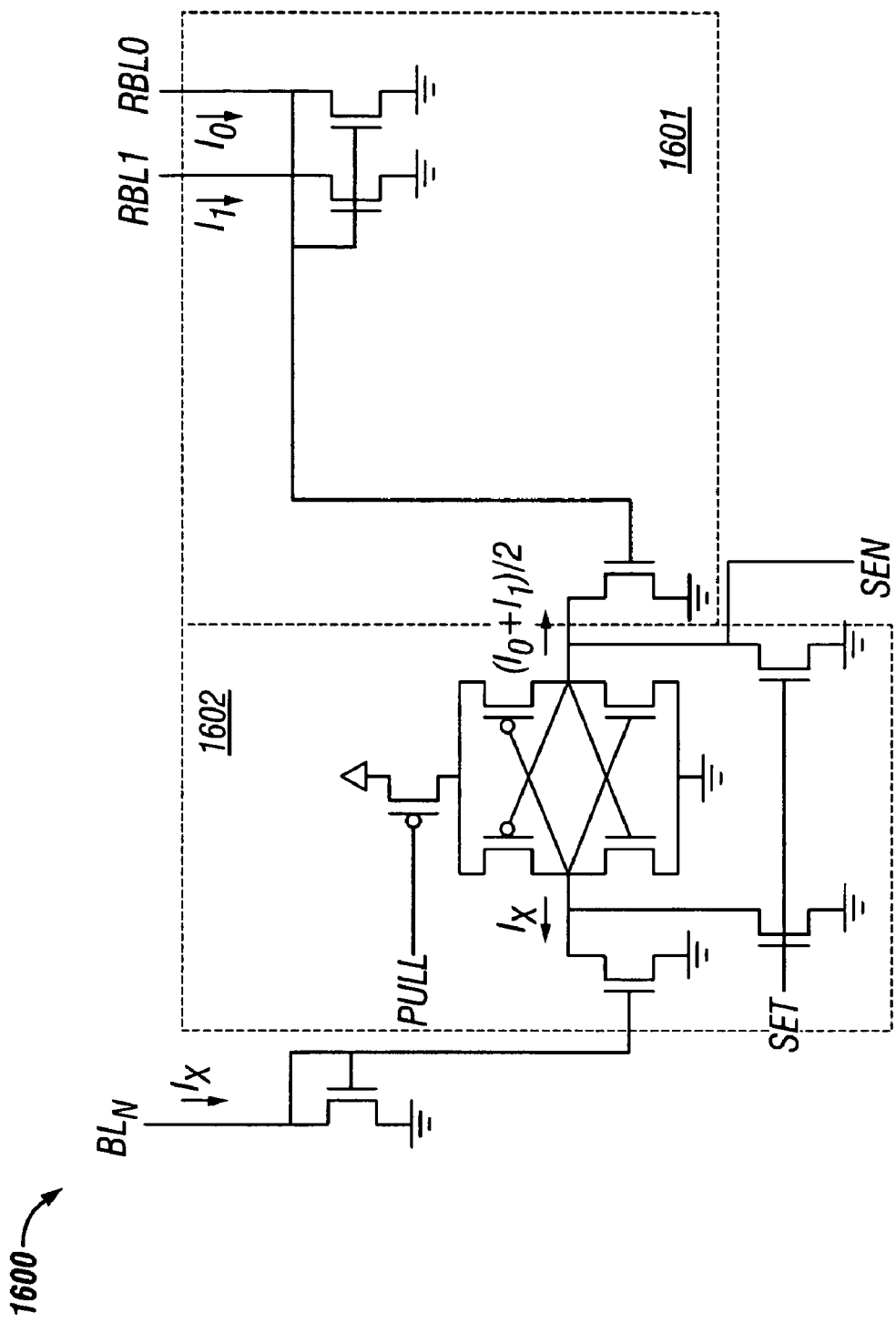
FIG. 16 is a schematic diagram illustrating an exemplary circuit for detecting the output of a selected memory cell according to the present invention.

FIG. 16 is a schematic diagram illustrating an exemplary circuit 1600 for detecting the output of a selected memory cell according to the present invention. To compensate for differences between capacitors in different memory layers caused by processing variations and different fatigue and disturbance histories, the currents from multiple reference memory cells and from multiple reference trees are averaged using a current mirror. For example, FIG. 16 shows a current $I_X$ that flows on a bit line $BL_N$ as a result of the value stored on a selected memory cell (not shown). Current $I_1$ flowing on a bit line $RBL_1$ as a result of a 1 being stored on a reference memory cell along the same plate line (not shown) and current $I_0$ flowing on a bit line RBL0 as a result of a 0 being stored on a reference memory cell along the same plate line (not shown) is averaged by current mirror 1601. Current $I_X$ is compared by comparator circuit 1602 to averaged current $(I_0+I_1)/2$ and outputs either a high or low signal on a SEN line depending on whether $I_X$ is greater or less than $(I_0+I_1)/2$. While FIG. 16 shows the reference current output from only two reference memory cells being averaged, it should be understood that each respective reference current could represent the average output current for a plurality of reference cells, thereby producing a more precise reference value. The use of reference memory trees can account for differences between capacitors along different plate lines caused by processing variations and different fatigue and disturbance histories.

The technique of the present invention is similar to the 2C/WL reference technique described by A. Sheikholeslami et al., "A Survey of Circuit Innovations in Ferroelectric Random-Access Memories," Proceedings of the IEEE, Vol. 88, pp. 667-689 (2000), but differs by having two reference memory trees per row of trees rather than two capacitors per word line because of the unique 3-D architecture. The technique of the present invention solves many problems related to differences among capacitors in different memory layers due to process variations and differences between cells due to different fatigue and disturbance history for capacitors along different plate lines.

Figure 17:
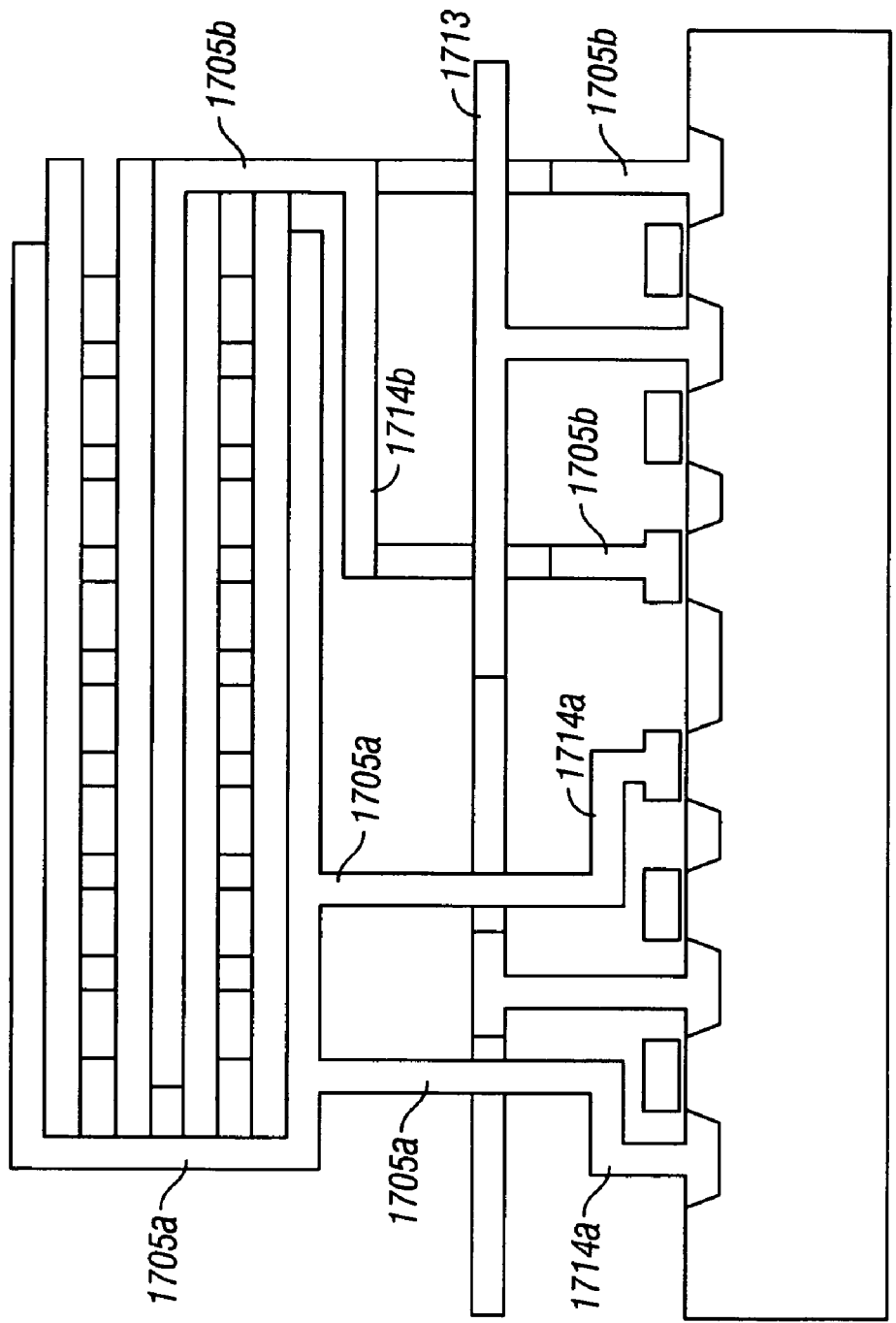
FIGS. 17-19 depict an arrangement of a 3-D memory according to the present invention having tree structures that are placed only 2F apart, in which F is the lithography half-pitch.
Figure 18:
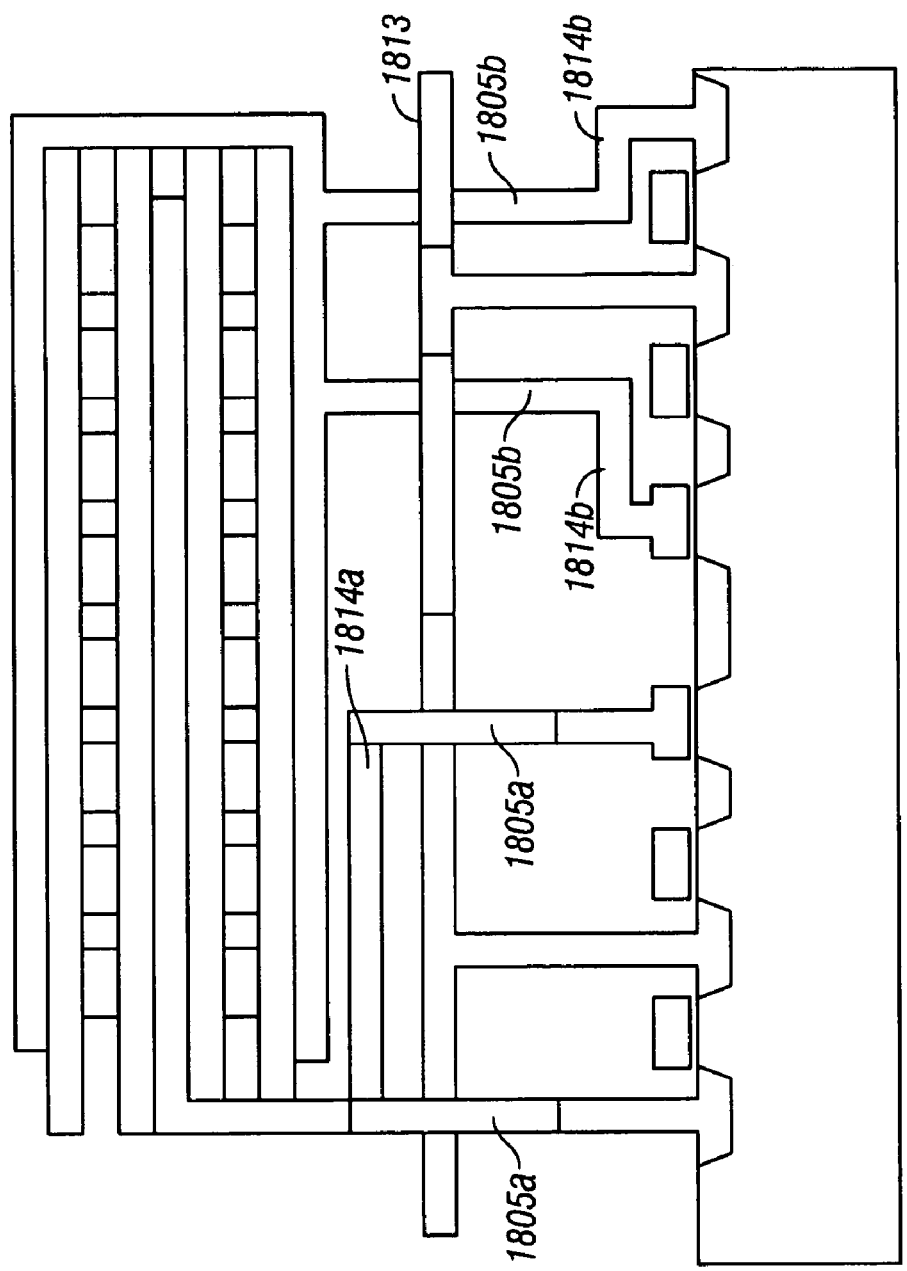
Figure 19:
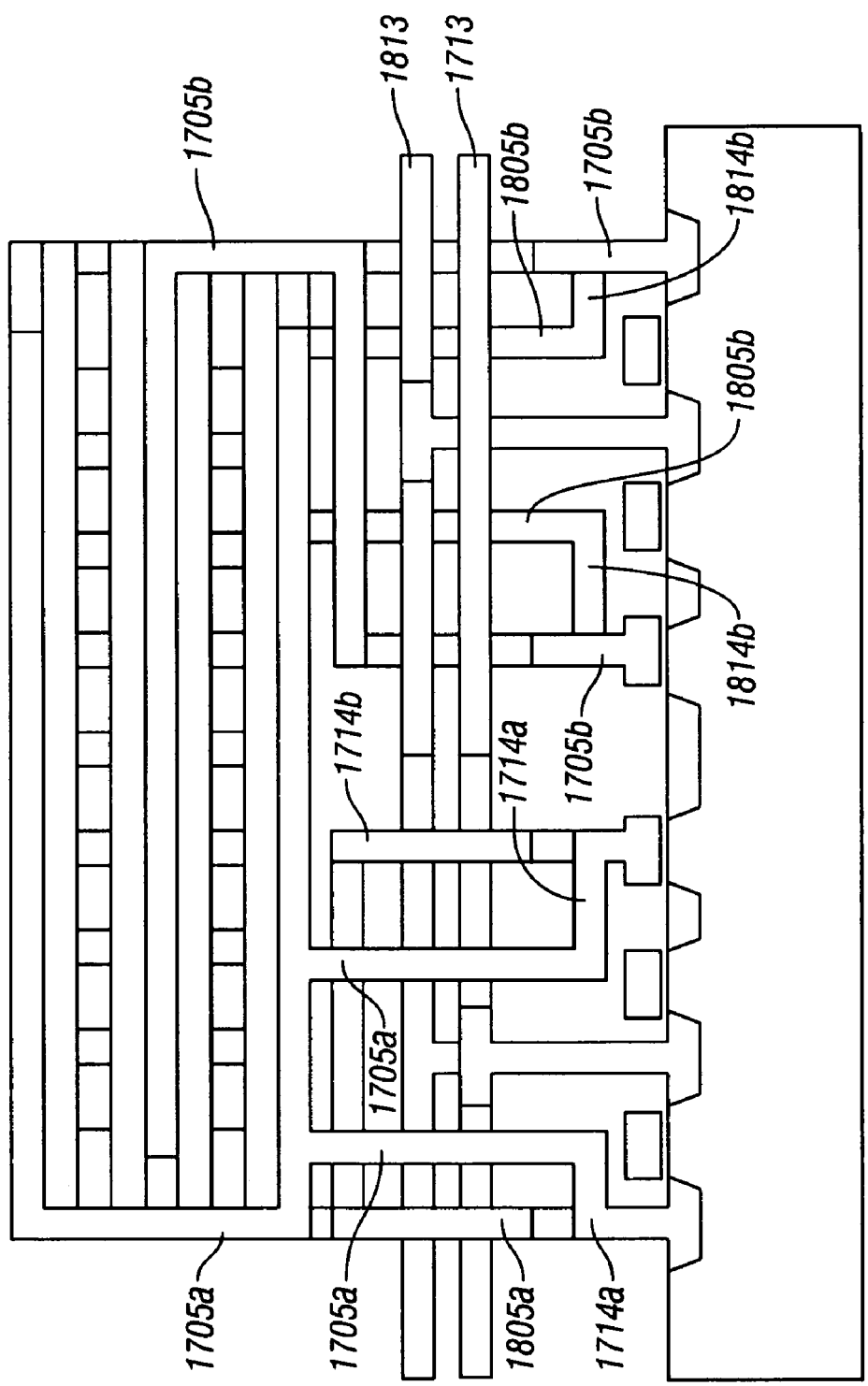

FIGS. 17-19 depict an arrangement of a 3-D memory according to the present invention having tree structures that are placed only 2F apart, in which F is the lithography half-pitch. This reduces the cell size by a factor of two and doubles the areal density. To achieve such close spacing, two bit lines must snake through the tree trunks in two levels, while making contact to two different trees in the same row of trees. The arrangement of active components in FIGS. 17-19 is similar to the arrangement of active components shown in FIGS. 3 and 9-12, and is not indicated to simplify FIGS. 17-19. Additionally, memory cells and branch portions are not indicated in FIGS. 17-19 to further simply FIGS. 17-19.

FIG. 17 shows the front two trees 1705a and 1705b of a pair of tree rows. Tree trunk structure 1705, conductive branch structure 1714 and bit line structure 1713 associated with trees 1705a and 1705b shown by a block outline are physically in front of tree trunk, conductive branch and bit line structure shown by a diagonal cross hatching.

FIG. 18 shows the second two trees 1805a and 1805b in the pair of tree rows, that is, the trees appearing behind trees 1705a and 1705b. Tree trunk structure 1805, conductive branch 1814 and bit line structure 1813 associated with trees 1805a and 1805b shown by a block outline is physically in front of tree trunk, conductive branch and bit line structure shown by a diagonal cross hatching.

FIG. 19 shows the tree trunk and bit line structure associated with both pairs of trees 1705a and 1705b, and 1805a and 1805b. Tree trunk structure, conductive branch structure and bit line structure associated with the trees shown by a block outline is physically in front of tree trunk, conductive branch and bit line structure shown by a diagonal cross hatching. Many other possibilities exist.

Thus, the 3-D memory according to the present invention can potentially replace FLASH memory for solid-state storage. Moreover, a cost analysis estimate suggests that the 3-D memory according to the present invention could even be a viable alternative to HDDs in the future. The very high performance of ferroelectric memory of the invention relative to HDDs could also eliminate the need for large amounts of DRAM in computer systems.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory device, comprising:
   a plurality of bit lines formed on a substrate and arranged substantially in a first plane and extending substantially in a first direction;
   a plurality of layers, each layer having an array of memory cells;
   a plurality of tree structures, at least one tree structure corresponding to each bit line, each tree structure having a trunk portion and at least one branch portion, each branch portion of a tree structure corresponding to at least one layer, the trunk portion of each tree structure extending from the substrate, each branch portion of a tree structure extending from the trunk portion of the tree structure, and each tree structure corresponding to a plurality of layers; and a plurality of plate line groups, each plate line group including a plurality of plate lines and corresponding to at least one layer, each respective plate line group overlapping branch portions of each tree structure in at least one row of tree structures at a plurality of intersection regions, a memory cell being located at each intersection region in a layer.

2. The memory device according to claim 1, wherein at least one memory cell is a ferroelectric-capacitor memory cell.

3. The memory device according to claim 1, wherein at least one memory cell is a hysteretic-resistor memory cell.

4. The memory device according to claim 1, wherein the trunk portion of at least one tree structure includes a plurality of vias, and at least one via is offset from at least one other via.

5. The memory device according to claim 1, wherein the trunk portion of at least one tree structure includes a plurality of vias that are in line with each other.

6. The memory device according to claim 1, wherein each respective plate line group is arranged in a direction that is substantially perpendicular to a direction the branch portion of each tree structure extends.

7. The memory device according to claim 1, wherein the branch portions of each tree structure extend substantially in a direction that is parallel to the first direction.

8. The memory device according to claim 1, wherein the plurality of tree structures is arranged in a plurality of rows of tree structures.

9. The memory device according to claim 1, further comprising:
a plurality of cell layer lines extending substantially in the first direction;
a plurality of cell column lines extending in a direction that is substantial perpendicular to the first direction and overlapping the plurality of cell layer lines at a plurality of second intersection regions; and
a plurality of plate-line driver transistors arranged in a two-dimensional array, each respective plate-line driver transistor corresponding to and being located at a respective second intersection region, and a connection being formed between each plate line and the plate-line driver corresponding to the plate line.

10. The memory device according to claim 9, wherein each plate-line driver transistor has a control terminal, and
wherein a cell column line corresponding to each plate-line driver transistor is coupled to the control terminal of the plate-line driver transistor.

11. The memory device according to claim 9, wherein each plate-line driver transistor has a control terminal, and
wherein a cell layer line corresponding to each plate-line driver transistor is coupled to the control terminal of the plate-line driver transistor.

12. The memory device according to claim 1, further comprising:
a plurality of access lines formed on the substrate, extending in a direction that is substantially perpendicular to the first direction and overlapping the bit lines at a plurality of second intersection regions, each second intersection region corresponding to a tree structure, each access line further corresponding to a tree structure row; and
a plurality of access transistors, each respective access transistor corresponding to and being located at a respective second intersection region, each respective access transistor further being electrically disposed between the tree structure and the bit line corresponding to the second intersection region, each respective access transistor having a control terminal and further being coupled to the access line corresponding to the second intersection region.

13. The memory device according to claim 12, wherein each access line is a write line and each access transistor is a write transistor,
the memory device further comprising:
a plurality of read transistors that are each electrically disposed between a tree structure and the bit line corresponding to the tree structure;
a plurality of read lines formed on the substrate, extending in a direction that is substantially perpendicular to the first direction and overlapping the bit lines at a plurality of third intersection regions, each third intersection region corresponding to a tree structure, each read line further corresponding to a tree structure row; and
a plurality of read transistors, each respective read transistor corresponding to and being located at a respective third intersection region, each respective read transistor further being electrically disposed between the tree structure and the bit line corresponding to the third intersection region, each respective read transistor having a control terminal and further being coupled to the read line corresponding to the third intersection region.

14. The memory device according to claim 13, further comprising a plurality of gain transistors, each gain transistor corresponding to a read transistor and being disposed between the read transistor and the tree structure corresponding to the read transistor, each gain transistor including a control terminal that is coupled to the corresponding tree structure.

15. The memory device according to claim 1, further comprising:
a plurality of read lines formed on the substrate, extending in a direction that is substantially perpendicular to the first direction and overlapping the bit lines at a plurality of second intersection regions, each second intersection region corresponding to a tree structure, each read line further corresponding to a tree structure row and being electrically coupled to the read transistor that is electrically disposed between each corresponding tree structure and the bit line corresponding to the tree structure; and
a plurality of read transistors, each respective read transistor corresponding to and being located at a respective second intersection region, each respective read transistor further being electrically disposed between the tree structure and the bit line corresponding to the second intersection region, each respective read transistor having a control terminal and further being coupled to the read line corresponding to the second intersection region.

16. The memory device according to claim 15, further comprising a plurality of gain transistors, each gain transistor corresponding to a read transistor and being disposed between the read transistor and the tree structure corresponding to the read transistor, each gain transistor including a control terminal that is coupled to the corresponding tree structure.

17. The memory device according to claim 1, wherein at least one memory cell has ferroelectric material with a pillar-like structure.

18. The memory device according to claim 1, wherein a plurality of memory cells are connected by a ferroelectric wire.

19. The memory device according to claim 1, wherein a plurality of memory cells are connected by a ferroelectric film.

20. The memory device according to claim 1, further comprising:
- at least one tree having a plurality of associated memory cells containing a first value;
- at least one tree having a plurality of associated memory cells containing a second value that is different from the first value;
- an averaging circuit outputting an average of an output of each tree having a plurality of associated memory cells containing the first value with an output of each tree having a plurality of associated memory cells containing the second value; and
- a comparator circuit determining an output value of a selected memory cell of the memory device based on the output of the averaging circuit.

21. A memory device, comprising:
- a plurality of bit lines formed on a substrate, arranged substantially in a first plane and extending substantially in a first direction;
- a three-dimensional memory having a plurality of layers;
- a plurality of plate lines arranged in each layer of the three-dimensional memory; and
- a plurality of plate-line driver transistors formed on the substrate and arranged in a two-dimensional array, each plate-line driver transistor corresponding to a plate line.

22. The memory device according to claim 21, further comprising:
- a plurality of cell layer lines extending substantially in the first direction;
- a plurality of cell column lines extending in a direction that is substantial perpendicular to the first direction and overlapping the plurality of cell layer lines at a plurality of second intersection regions; and
- wherein each respective plate-line driver transistor corresponding to and being located at a respective second intersection region, and a connection being formed between each plate line and the plate-line driver corresponding to the plate line.

23. The memory device according to claim 21, wherein each layer of the three-dimensional memory includes an array of memory cells.

24. The memory device according to claim 23, wherein at least one memory cell has ferroelectric material with a pillar-like structure.

25. The memory device according to claim 23, wherein a plurality of memory cells are connected by a ferroelectric wire.

26. The memory device according to claim 23, wherein a plurality of memory cells are connected by a ferroelectric film.

27. The memory device according to claim 23, wherein at least one memory cell is a ferroelectric-capacitor memory cell.

28. The memory device according to claim 23, wherein at least one memory cell is a hysteretic-resistor memory cell.

29. The memory device according to claim 21, further comprising:
- at least one tree having a plurality of associated memory cells containing a first value;
- at least one tree having a plurality of associated memory cells containing a second value that is different from the first value;
- an averaging circuit outputting an average of an output of each tree having a plurality of associated memory cells containing the first value with an output of each tree having a plurality of associated memory cells containing the second value; and
- a comparator circuit determining an output value of a selected memory cell of the memory device based on the output of the averaging circuit.

* * * * *